United States Patent
Tanaka

Patent Number: 5,815,594
Date of Patent: Sep. 29, 1998

[54] SEMICONDUCTOR EXPOSURE METHOD AND APPARATUS

[75] Inventor: Hiroshi Tanaka, Kamakura, Japan

[73] Assignee: Canon Kabushiki Kaisha, Tokyo, Japan

[21] Appl. No.: 465,566

[22] Filed: Jun. 5, 1995

Related U.S. Application Data

[63] Continuation of Ser. No. 998,609, Dec. 30, 1992, abandoned.

[30] Foreign Application Priority Data

Jan. 10, 1992 [JP] Japan .................................. 4-022056

[51] Int. Cl.⁶ ..................................................... G06K 9/03
[52] U.S. Cl. ............................... 382/151; 348/87; 438/16
[58] Field of Search .................................... 382/145, 151, 382/309; 348/87, 94, 95, 126; 438/14, 16

[56] References Cited

U.S. PATENT DOCUMENTS

| | | | |
|---|---|---|---|
| 4,475,122 | 10/1984 | Green | 382/8 |
| 4,704,020 | 11/1987 | Murakami et al. | 353/122 |
| 4,938,600 | 7/1990 | Into | 348/126 |
| 4,962,423 | 10/1990 | Yamada et al. | 382/8 |
| 4,985,722 | 1/1991 | Ushijima et al. | 354/319 |
| 5,040,228 | 8/1991 | Bose et al. | 382/8 |
| 5,050,111 | 9/1991 | Ayata et al. | 382/8 |
| 5,153,916 | 10/1992 | Inagaki et al. | 382/4 |

*Primary Examiner*—Michael T. Razavi
*Assistant Examiner*—Jon Chang
*Attorney, Agent, or Firm*—Fitzpatrick, Cella, Harper & Scinto

[57] ABSTRACT

A method of exposing a semiconductor substrate with an exposure apparatus and correcting the position, measured by a detector of the exposure apparatus, of the surface of the semiconductor substrate with respect to a focal plane of a projection optical system, includes the steps of printing an inspection pattern on a semiconductor inspection substrate with the exposure apparatus, developing the printed inspection pattern, obtaining an image of the developed inspection pattern with a charge-coupled device camera, calculating a measurement error in the position of the surface of the semiconductor inspection substrate measured by the detector during exposure of the semiconductor inspection substrate based upon the obtained image and storing the calculated measurement error in a controller, and correcting the measured position measured by the detector during subsequent exposure of the substrate by the exposure apparatus based upon the calculated measurement error stored in the controller. An apparatus for performing this method is also disclosed.

10 Claims, 17 Drawing Sheets

FIG.12(a)
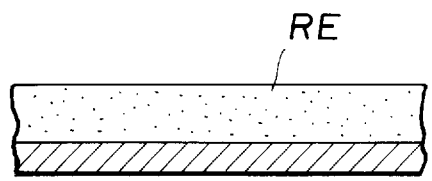
FIG.12(b)
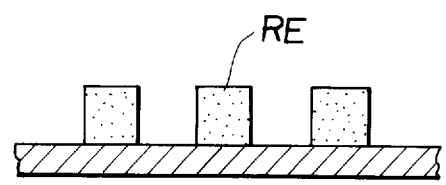
FIG.12(c)
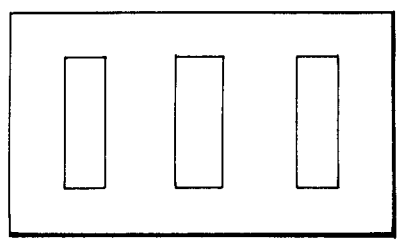
FIG.12(d)
FIG.12(e)
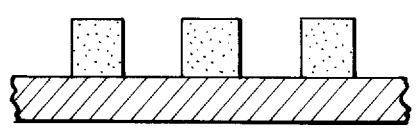
FIG.12(f)
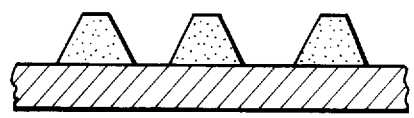

FIG.13(a)      FIG.13(b)
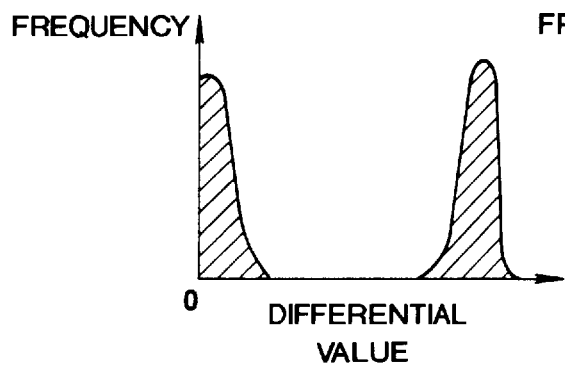
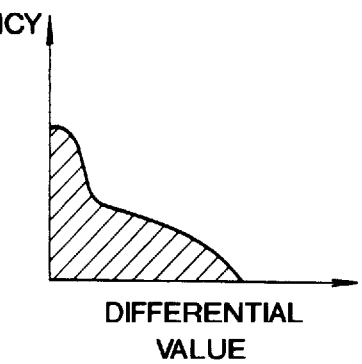
FIG.14
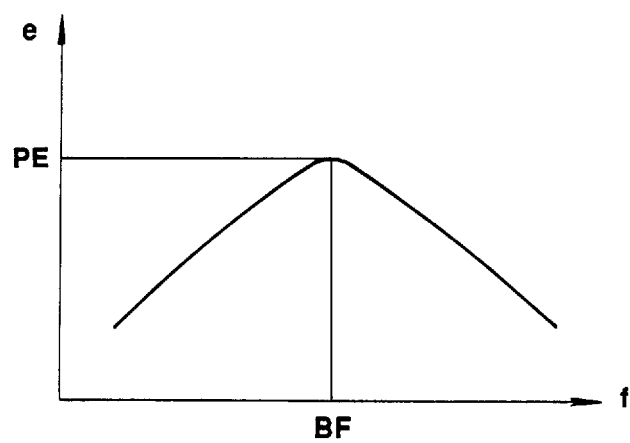

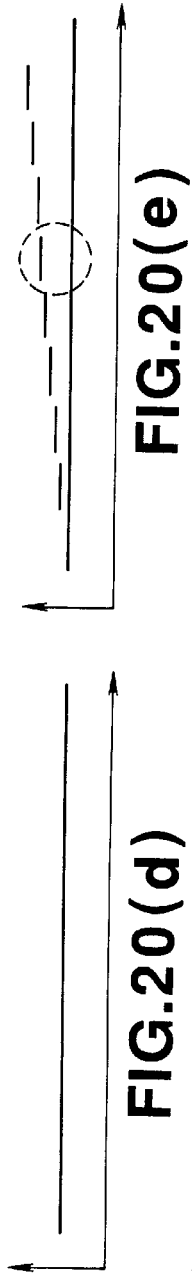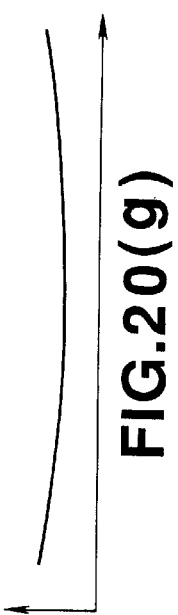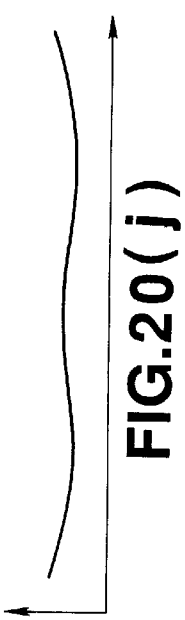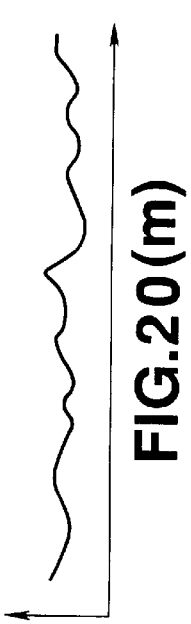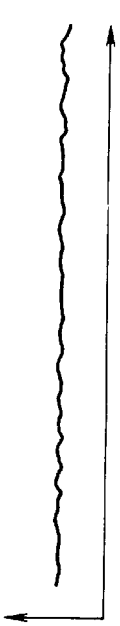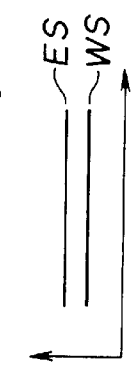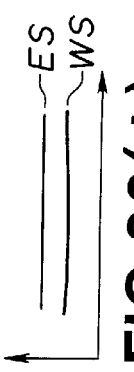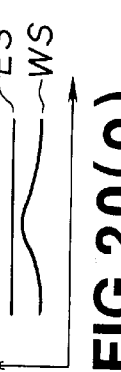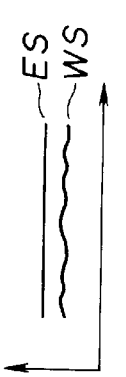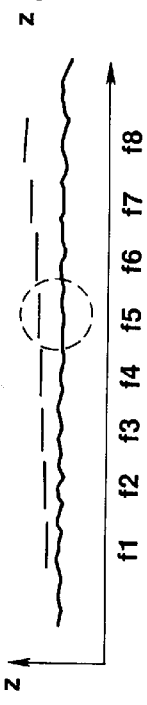

SEMICONDUCTOR EXPOSURE METHOD AND APPARATUS

This application is a continuation of application Ser. No. 07/998,609 filed Dec. 30, 1992, now abandoned.

BACKGROUND OF THE INVENTION

1. Field of the Invention

This invention relates to a semiconductor exposure method and apparatus in which a substrate, such as a wafer or the like, is exposed using a reduction projection exposure apparatus (hereinafter termed a "stepper") having an autofocusing mechanism, and more particularly, to a semiconductor exposure method and apparatus in which the accuracy of exposure is improved by correcting a measurement error of measuring means of an autofocusing mechanism.

2. Description of the Related Art

In a reduction projection exposure apparatus (stepper), it is necessary to exactly adjust the focus of a projection lens system on the position of a substrate, such as a wafer or the like, by detecting the distance and the relative inclination between the lens of the system and the substrate by measuring means, such as a focus sensor or the like. A conventional focus sensor performs measurement using, for example, the air or light. The method which uses the air cannot finely measure the inclination and the surface shape of a substrate within an exposure region, since the size of the leading end of the focus sensor cannot be reduced. The method which uses light measures the surface position of a substrate by projecting light onto a semitransparent resist coated on the substrate. Hence, the method apts to be influenced not only by light reflected by the surface of the resist, but also by light reflected by the surface of the substrate after entering the resist. Furthermore, since the reflectivity of the surface of the substrate differs according to the position illuminated by the light, the accuracy in the measurement is reduced. In order to correct such errors produced in a focus sensor, in some apparatuses, a photoelectric transducer or the like is mounted on a stage for mounting a substrate, and a mechanism is provided which detects an error by converting the intensity of exposure light when the light is projected through a lens, the position and the phase of the light, or the like, into a focus value. In another type of apparatus, a focus sensor itself is used, and means for estimating an error by performing repeated measuring operations or measuring operations for slightly shifted positions is provided.

However, all of these apparatuses do not directly measure the distance and the relative inclination between a substrate and a lens during exposure. Accordingly, before exposing a substrate which will become a finished semiconductor product, it is necessary to expose an inspection substrate using the above-described focus sensor, to detect a defocused state by visually inspecting an inspection pattern printed on the inspection substrate, or by automatically measuring the line width of the inspection pattern printed on the inspection substrate using an electron microscope having a length-measuring function, and to calculate the distance and the relative inclination between the inspection substrate and the lens during exposure, and thereby to correct the detection value of the focus sensor during exposure of the substrate which will become a finished semiconductor product.

In such conventional apparatuses, however, since visual inspection by operators requires a long inspection time, a semiconductor production line must be interrupted for a long time. In addition, errors in the measurement caused by fatigue of the operators and differences in the measurement among the operators are not negligible. Moreover, automatic measurement using an electron microscope requires a large-scale dedicated apparatus.

SUMMARY OF THE INVENTION

It is an object of the present invention to overcome the above-described problems in the prior art.

It is another object of the present invention to provide a semiconductor exposure apparatus which can automatically correct its autofocusing mechanism with high precision without requiring visual inspection or an independent inspection apparatus.

It is still another object of the present invention to provide a semiconductor exposure apparatus which can continuously and automatically correct an autofocusing mechanism of a stepper.

According to one aspect, the present invention which achieves these objectives relates to a semiconductor exposure method using a stepper comprising image pickup means for receiving light reflected by an alignment mark on a substrate illuminated by illuminating light to obtain an image of the alignment mark, and measuring means for measuring the distance and the relative inclination between a reduction projection lens system and the substrate. The method comprises the steps of printing an inspection pattern on an inspection substrate by the stepper, developing the inspection substrate on which the inspection pattern has been printed, obtaining an image of the developed inspection pattern by the image pickup means, and calculating a measurement error of the measuring means during exposure of the inspection substrate using an image signal and storing the calculated value in control means. During the subsequent exposure of the substrate by the stepper, a measured value of the measuring means is corrected based on the measurement error stored in the control means.

According to another aspect, the present invention which achieves these objectives relates to a semiconductor exposure apparatus, comprising a stepper comprising image pickup means for receiving light reflected by a substrate illuminated by illuminating light to obtain an image of each of a plurality of alignment marks provided on the substrate and measuring means for measuring the distance and the relative inclination between a reduction projection lens system and the substrate, and an inspection-substrate processing apparatus comprising a resist coater and a developing unit. The inspection-substrate processing apparatus comprises first conveying means for conveying an inspection substrate, on which a resist is coated by the resist coater, to the stepper, second conveying means for conveying the inspection substrate exposed by the stepper to the developing unit, and control means for calculating and storing a measurement error of the measuring means based on the image obtained by the image pickup means, and for correcting a measured value of the measuring means during the subsequent exposure of the substrate by the stepper.

After developing the inspection substrate on which the inspection pattern has been printed, the inspection substrate is mounted again in the stepper, and an image of the inspection pattern is obtained using the image pickup means of an alignment mechanism of the stepper. The measurement error of the measuring means which has measured the distance and the relative inclination between the inspection substrate and the reduction projection lens system during the exposure of the inspection substrate is calculated using the image signal of the image, and the calculated value is stored in the control means. During the subsequent exposure of the substrate which will become a finished semiconductor product, the output of the measuring means is automatically corrected by the control means.

By providing the inspection-substrate processing apparatus, which comprises the resist coater, the developing unit, the first and second conveying means, and a path for moving the inspection substrate from the developing unit toward the resist coater, adjacent to the stepper, the preparatory processing, exposure and development of the inspection substrate, and the measurement of the measurement error are continuously and automatically performed, and the measured result is stored in the control means of the measuring means.

According to another aspect, the present invention which achieves these objectives relates to a method of exposing a semiconductor substrate with an exposure apparatus and correcting the position, measured by measuring means of the exposure apparatus, of the surface of the semiconductor substrate with respect to a focal plane of a projection optical system. The method comprises the steps of printing an inspection pattern on a semiconductor inspection substrate with an exposure apparatus, developing the printed inspection pattern, obtaining an image of the developed inspection pattern with image pickup means, calculating a measurement error in the position of the surface of the semiconductor inspection substrate measured by the measuring means during exposure of the semiconductor inspection substrate based in the obtained image and storing the calculated measurement error in control means, and correcting the measured position measured by the measuring means during subsequent exposure of the substrate by the exposure apparatus based in the calculated measurement error stored in the control means.

The distance between the projection optical system and the semiconductor inspection substrate can be changed every time the inspection pattern is printed on each of a plurality of exposure regions of the semiconductor inspection substrate. When this is the case, the printing step can comprise the step of printing the inspection pattern on each of the plurality of exposure regions, the developing step comprises the step of developing the printed inspection patterns on each of the plurality of exposure regions, and the obtaining step comprises the step of obtaining an image of each of the developed inspection patterns. In addition, in this embodiment the measuring means measures the distance from the surface of the semiconductor inspection substrate to the focal plane and measures the inclination of the semiconductor inspection substrate. Also, the calculating step comprises the step of estimating a measurement error in the measured distance measured by the measuring means utilizing changes in evaluation values of the image of the inspection pattern obtained in the obtaining step caused by variations in the exposure regions, and calculating an error in the measured inclination measured by the measuring means from the distribution of evaluation values for all images of the inspection pattern obtained in the obtaining step.

The method can further comprise the step of aligning the semiconductor inspection substrate and a reticle using image pickup means. The method can further comprise the step of aligning the semiconductor inspection substrate and a projection optical system using the image pickup means. The method can also comprise the step of providing an off-axis optical system which is different from the projection optical system and which comprises the image pickup means.

According to still another aspect the present invention which achieves these objectives relates to a semiconductor exposure system, comprising an exposure apparatus comprising image pickup means for obtaining an image of each of a plurality of alignment marks provided on a semiconductor inspection substrate, and measuring means for measuring the position of a surface of the semiconductor inspection substrate with respect to a focal plane of a projection optical system. The apparatus further comprises a substrate processing apparatus, comprising a resist coater for coating a resist on the semiconductor inspection substrate and a developing unit, first conveying means for conveying the semiconductor inspection substrate on which a resist is coated by the resist coater to the exposure apparatus, second conveying means for conveying the semiconductor inspection substrate exposed by the exposure apparatus to the developing unit, and a control unit. The control unit calculates a measurement error in the measured position measured by the measuring means based on the image obtained by the image pickup means, stores the calculated measurement error, and corrects a measured position measured by the measuring means during a subsequent exposure of the substrate by the exposure apparatus.

The foregoing and other objects, advantages and features of the present invention will become more apparent from the following detailed description of the preferred embodiments taken in conjunction with the accompanying drawings.

BRIEF DESCRIPTION OF THE DRAWINGS

FIG. 11(*b*) is a schematic diagram showing an enlarged view of the inspection pattern within circle K shown in FIG. 11(*a*);

FIG. 11(*c*) is a schematic diagram showing the arrangement of inspection patterns superposed on an IC (integrated circuit) pattern;

FIG. 11(*d*) is a schematic diagram showing an enlarged view of the inspection pattern within circle L shown in FIG. 11(*c*);

FIG. 11(*e*) is a schematic diagram showing an enlarged view of the inspection pattern within circle M shown in FIG. 11(*c*);

FIG. 12(*a*) is a partial cross-sectional view of a resist film before exposure;

FIG. 12(b) is a partial cross-sectional view of a resist film after exposing, printing and developing an inspection pattern thereon;

FIG. 12(c) is an image of the resist film shown in FIG. 12(b) taken by a first CCD (charge-coupled device) camera;

FIG. 12(d) is a diagram showing an image signal of the image shown in FIG. 12(c) to be input to a control unit;

FIG. 12(e) is a diagram showing a cross-sectional view of an inspection pattern, and an image signal representing the inspection pattern in a best focused state;

FIG. 12(f) is a diagram showing a cross-sectional view of an inspection pattern, and an image signal representing the inspection pattern in a defocused state;

6 FIG. 13(a) is a histogram of differential values of the image signal shown in FIG. 12(e);

FIG. 13(b) is a histogram of differential values of the image signal shown in FIG. 12(f);

FIG. 14 is a graph illustrating the relationship between an evaluation value e of an inspection mark arranged at a predetermined position of each exposure region and a focus value f of the exposed region;

FIGS. 15(a) through 15(d) are explanatory diagrams illustrating a method of determining the sign of the focus for each inspection mark from changes in the inclination and the evaluation value of each exposure region, in which FIG. 15(a) is a schematic diagram illustrating an exposure region inclined upwardly in the rightward direction with respect to a best focused surface at three different distances, $f_1$, $f_2$ and $f_3$, from reduction projection lens system 3;

FIG. 15(b) is a graph in which evaluation values for respective points $P_1$ and $P_2$ in the exposure region at the distances $f_1$, $f_2$ and $f_3$, shown in FIG. 15(a) are plotted;

FIG. 15(c) is a schematic diagram illustrating an exposure region inclined downwardly in the rightward direction with respect to a best focused state at three different positions $f_1$, $f_2$ and $f_3$, with respect to reduction projection lens system 3;

FIG. 15(d) is a graph in which evaluation values for respective points $P_1$ and $P_2$ in the exposure region at the three positions, $f_1$, $f_2$ and $f_3$, shown in FIG. 15(c) are plotted;

FIGS. 20(a) through 20(o) are schematic diagrams illustrating various kinds of wafer surfaces.

DESCRIPTION OF THE PREFERRED EMBODIMENTS

Figure 1:
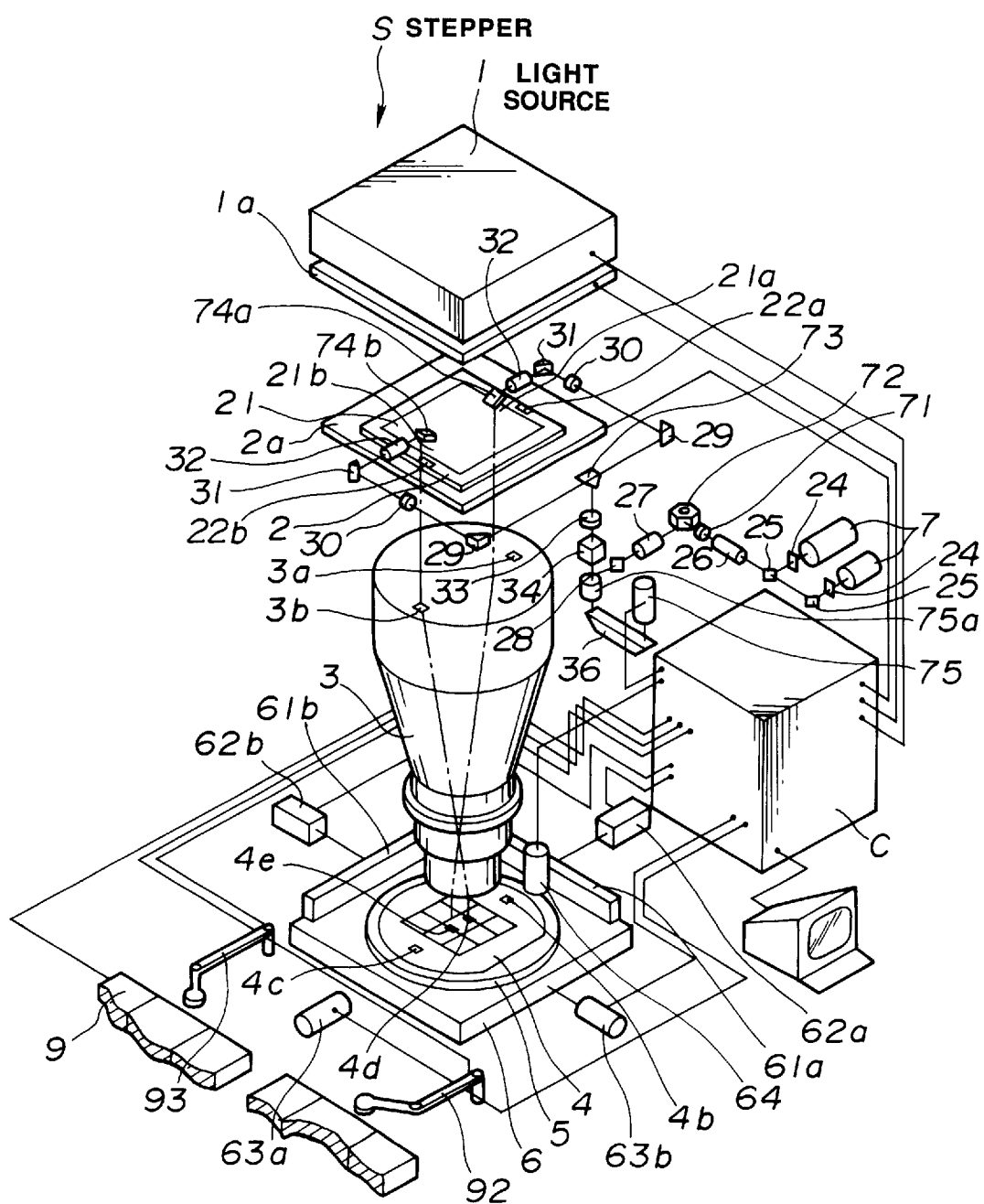
FIG. 1 is a schematic perspective view of a stepper which constitutes a part of a semiconductor exposure apparatus according to a first embodiment of the present invention.

FIG. 1 is a perspective view of a stepper which constitutes a part of a semiconductor exposure apparatus according to a first embodiment of the present invention. In FIG. 1, reduction projection exposure apparatus (stepper) S includes light source 1 for emitting illuminating light for exposure, exposure shutter 1a, reticle stage 2a for mounting reticle 2, reduction projection lens system 3, wafer chuck 5 for holding wafer 4, comprising a substrate which will become a finished semiconductor product, or an inspection substrate, an XY stage 6 for holding wafer chuck 5, alignment light sources 7 for performing alignment between wafer 4 and reticle 2, lenses 24, mirrors 25, and lens 26 for providing a light path from alignment light sources 7 to a diffusing plate 71 constituting the optical system of alignment light source 7, polygonal mirror 72, lens 27, mirror 28, prism 73, a pair of mirrors 74a and 74b disposed above respective end portions of reticle 2, a pair of branching optical systems (i.e., left and right branch optical systems) to provide a light path from prism 73 to respective mirrors 74a and 74b, and a first CCD camera 75, serving as image pickup means. Each branching optical system comprises a prism 29, a lens 30, a prism 31 and a lens 32. Light from prism 73 is transmitted to the first CCD camera 75 via a lens 33, a prism 34, an erector lens 75b, and a prism 36.

Figure 3:
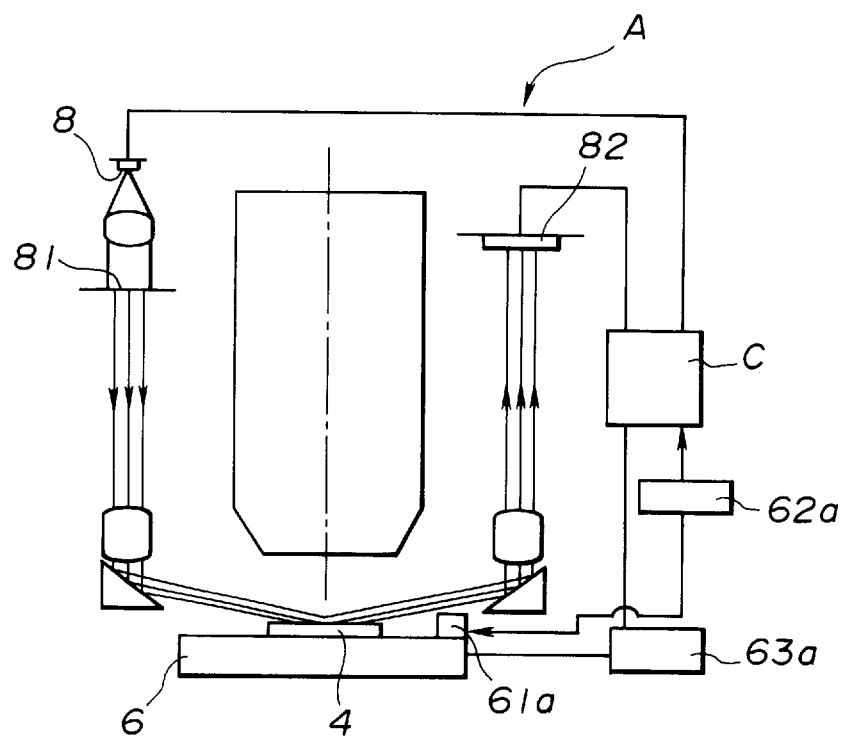
FIG. 3 is a schematic diagram illustrating an autofocusing mechanism.

Autofocusing mechanism A comprises focus light source 8 shown in FIG. 3, slit 81, and second CCD camera 82, serving as measuring means. These units are disposed in the vicinity of lens system 3, but are omitted in FIG. 1.

Reticle 2 includes reticle pattern 21, and a pair of reticle alignment marks 22a and 22b on outer circumferential portions thereof. Reticle pattern 21 includes a pair of reticle marks 21a and 21b.

XY stage 6 is reciprocatable along two orthogonal axes (the x axis and the y axis) within a plane parallel to XY stage 6 and along an axis (the z axis) perpendicular to the above-described plane by a known 6-axes-driven table mechanism or the like, and is rotatable around the x, y and z axes.

The position of XY stage 6 in the x-axis direction is measured by X mirror 61a and X laser length-measuring unit 62a which are integral with XY stage 6, and is moved by X motor 63a. In the same manner, the position of XY stage 6 in the y-axis direction is controlled by Y mirror 61b, Y laser length-measuring unit 62b, and Y motor 63b.

The position of XY stage 6 in the z-axis direction is measured by off-axis optical system 64 including a third CCD camera (not shown), and is adjusted by a driving unit (not shown) provided immediately below XY stage 6. The rotation angle, the direction and angle of inclination of XY stage 6 around the z axis are adjusted by a driving unit (not shown) disposed below XY stage 6.

Measured values of the alignment mechanism for reticle 2 and wafer 4, autofocusing mechanism A, the driving mechanism of XY stage 6, and the like are input to control unit C, serving as control means, and all the operations are automatically controlled.

Figure 2:
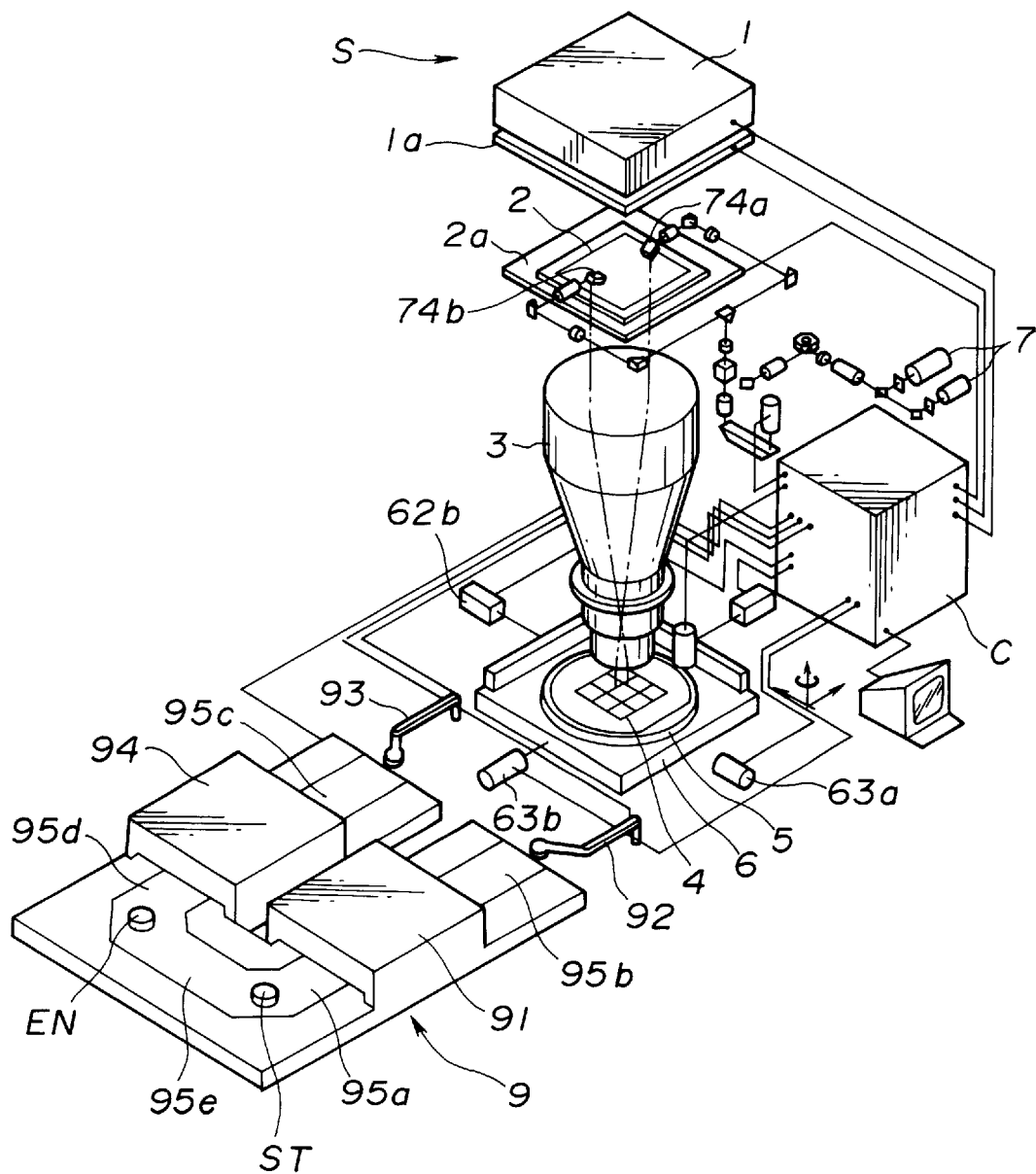
FIG. 2 is a schematic perspective view of the entire apparatus of the first embodiment.

FIG. 2 is a perspective view showing the entire semiconductor exposure apparatus. In FIG. 2, inspection-wafer processing apparatus 9, serving as an inspection-substrate processing apparatus, is provided adjacent to stepper S shown in FIG. 1. Inspection-wafer processing apparatus 9 includes resist coater 91 for coating a resist on wafer 4, serving as an inspection substrate, as preparatory processing, first automatic hand 92, serving as first conveying means, for conveying wafer 4, on which the resist is coated, to stepper S, second automatic hand 93, serving as second conveying means, for conveying wafer 4 exposed by stepper S from stepper S, developing unit 94 for developing wafer 4 after exposure, and first through fifth paths 95a–95e, serving as paths for wafer 4 for continuously performing a series of the above-described operations.

Figure 5:
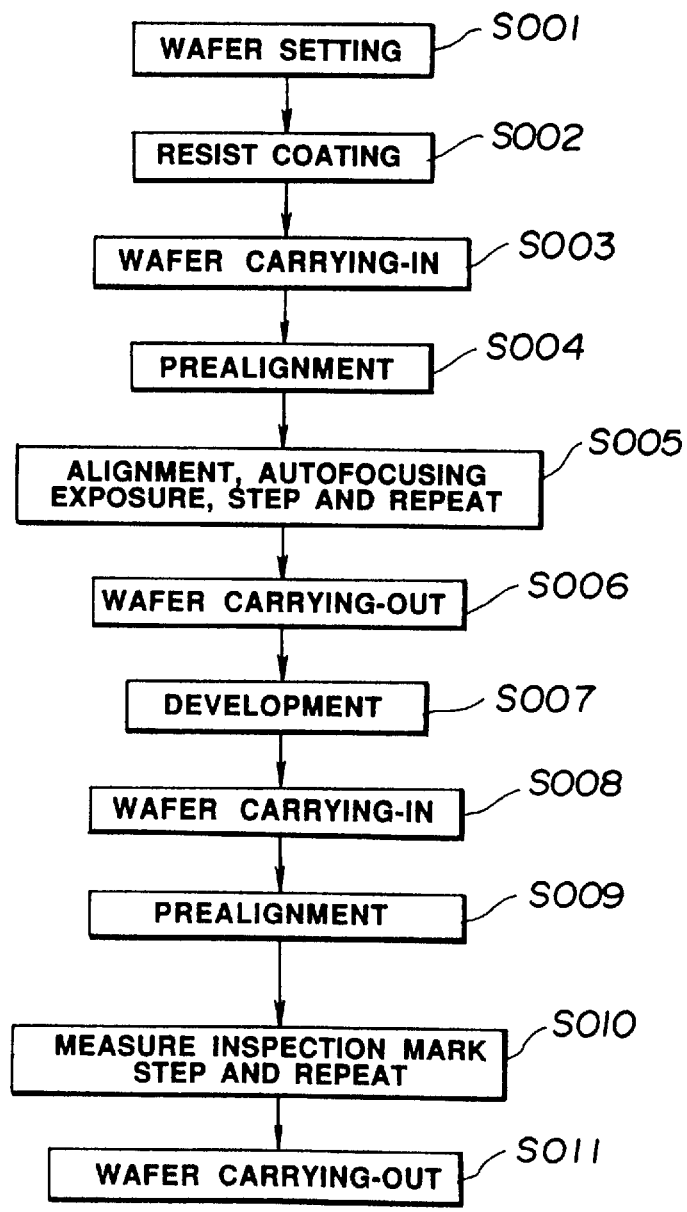
FIG. 5 is a flowchart of the first embodiment.

Next, a description will be provided of a procedure of automatically performing a series of operations, i.e., the preparatory processing, exposure, printing and development of wafer 4, serving as an inspection substrate, measurement of a defused state (hereinafter termed a defocus) of an inspection pattern printed on wafer 4, calculation of a measurement error of autofocusing mechanism A from the defocused state, and the like with reference to FIG. 5.

Wafer 4 mounted at start point ST of first path 95a (step S001) is conveyed to resist coater 91 and a resist is coated thereon (step S002). Wafer 4 is then conveyed to stepper S passing through second path 95b by first automatic hand 92 (step S003).

Prealignment is next performed for moving XY stage 6 in the x-axis and y-axis directions by predetermined distances so that first exposure region 4a of wafer 4 conveyed to stepper S is situated immediately below reduction projection lens system 3 (step S004). Thereafter, alignment and autofocusing processing (to be described later) of first exposure region 4a is performed, and first exposure region 4a is exposed by opening exposure shutter 1a, whereby an inspection pattern (to be described later) is printed.

After exposure and printing of first exposure region 4a (see FIG. 9), a second exposure region of wafer 4 is situated immediately below reduction projection lens system 3, and the alignment and autofocusing processing, exposure and printing of the second exposure region are sequentially performed. Thereafter, all exposure regions of wafer 4 are exposed to print the inspection pattern thereon according to a well-known step-and-repeat procedure (step S005).

Wafer 4 thus subjected to exposure and printing is conveyed to third path 95c by second automatic hand 93 (step S006), and the inspection pattern is developed by developing unit 94 (step S007).

Wafer 4 is conveyed again to first path 95a by passing through fourth path 95d and fifth path 95e, and reaches second path 95b while skipping a resist coating operation performed by resist coater 91, and is conveyed again to stepper S by first automatic hand 92 (step S008).

In stepper S, after performing prealignment in the same manner as in the case of exposure (step S009), an image of the inspection pattern on wafer 4 is imaged by CCD camera 75, a measurement error of autofocusing mechanism A of stepper S is calculated by performing image processing (to be described later) of the image, and an amount of correction based on the calculation is stored in control unit C, serving as control means (step S010). The inspection patterns in all regions of the wafer 4 are inspected, and a measurement error and an amount of correction are calculated according to a well known step-and-repeat procedure (step S010).

Wafer 4 subjected to the above-described inspection is conveyed again to third path 95c by automatic hand 93, and is taken outside the apparatus from end point EN of fourth path 95d skipping a development operation performed by developing unit 94 (step S011).

Next, a detailed description will be sequentially provided of the prealignment process (step S004), the exposure process of wafer 4, consisting of alignment, autofocusing, and step-and-repeat operations (step S005), and the measuring process of the defocus of the inspection pattern on wafer 4 after development (step S010).

First, the prealignment step S004 will be explained. Before conveying wafer 4 to stepper S, reticle alignment is performed using a pair of set marks 3a and 3b provided on the upper surface of reduction projection lens system 3 and the above-described reticle alignment marks 22a and 22b provided on reticle 2 by adjusting the position of reticle stage 2a. After wafer chuck 5, provided on XY stage 6, holds the wafer 4 by suction, the positions of a pair of wafer marks 4b and 4c on wafer 4 in the z-axis direction are measured. The position of XY stage 6 in the z-axis direction is set according to the result of the measurement. Thereafter, XY stage 6 is moved in the x-axis and y-axis directions so that first exposure region 4a of wafer 4 is situated immediately below reduction projection lens system 3.

Figure 4:
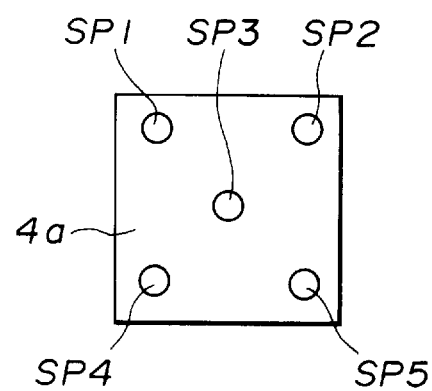
FIG. 4 is a schematic diagram illustrating measuring points on a first exposure region of a wafer.
Figure 6:
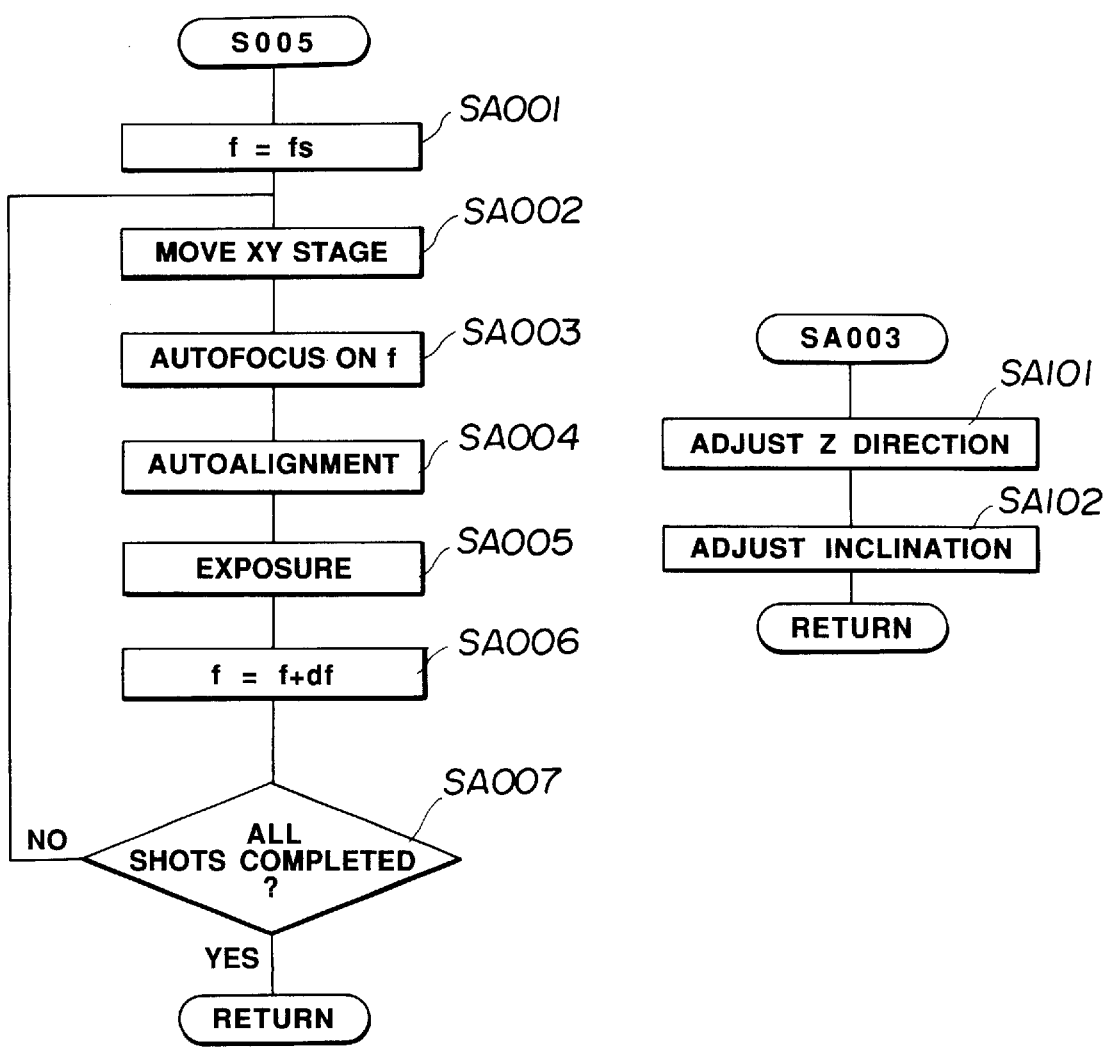
FIG. 6 is a flowchart showing the detail of a principal part of the flowchart shown in FIG. 5.

Next, the exposure process (step S005 shown in FIG. 5) will be explained with reference to FIG. 6. First the focus, i.e., the distance between the reduction lens system 3 and the wafer 4 on stage 6 in the z direction, is set to fs in step SA001. Then the XY stage 6 is moved in the x and/or y direction to expose the first exposure region in step SA002. As shown in FIG. 4, focus measurement points SP1, SP2, SP3, SP4 and SP5 are provided on first exposure region 4a of wafer 4, and deviations of light spots illuminating the respective measurement points are measured by autofocusing mechanism A shown in FIG. 3. The measurement of the five points is performed in the exposure region for the purpose of measuring the inclination of the focus plane from differences in the heights of the respective measurement points. Respective illuminating light beams obtained by separating light emitted from light source 8 by slit 81 obliquely illuminate wafer 4. Light beams reflected by wafer 4 are imaged onto second CCD camera 82. The position of a light spot on second CCD camera 82 deviates in proportion to the height of wafer 4. Control unit C calculates the amount of deviation of the light spots, calculates the amount of movement and inclination of XY stage 6 in the z-axis direction from the amounts of deviation of the five light spots, and drives a driving unit (not shown) of XY stage 6 in accordance with a calculated amount in the sequence of steps SA101 and SA102 to perform an autofocusing operation (step SA003).

After the completion of the autofocusing operation, alignment of reticle 2 with wafer 4 is performed (step SA004). Alignment light, which has substantially the same wavelength as exposure light, emitted from alignment light source 7 is diffused by diffusing plate 71 to reduce unevenness in illuminance, is then subjected to scanning by polygonal mirror 72 to enlarge the illuminating region, and is divided into right and left branches passing through left and right optical systems, respectively, by prism 73. In the left optical system, the alignment light is projected onto reduction projection lens system 3 by prism 29, lens 30, prism 31, lens 32, and mirror 74b, and illuminates wafer mark 4b. The image of wafer mark 4b made by reflected light returns through the reduction projection lens system 3, is reflected by mirror 74b and then passes back through lens 32, prism 31, lens 30, and prism 73 together with the image of reticle alignment mark 22b, is magnified by an erector lens 75a after passing through lens 33 and prism 34, and is imaged onto first CCD camera 75 via prism 36. The right alignment optical system has the same function as the left optical system. Alignment light in the right branch is projected onto the reduction projection lens system 3 from prism 73 via prism 29, lens 30, prism 31, lens 32, and mirror 74a. The light then travels through the reduction projection lens system 3 to illuminate the wafer mark 4c. The image of the wafer mark 4c reflected therefrom returns through the reduction projection lens system 3 and is reflected by mirror 74a and then passes back through lens 32, prism 31, lens 30, prism 29, and prism 73 and together with the image of the reticle alignment mark 22a, is magnified in the erector lens 75a after passing through lens 33 and prism 34, and is then imaged onto the first CCD camera 75 via prism 36.

Figure 9:
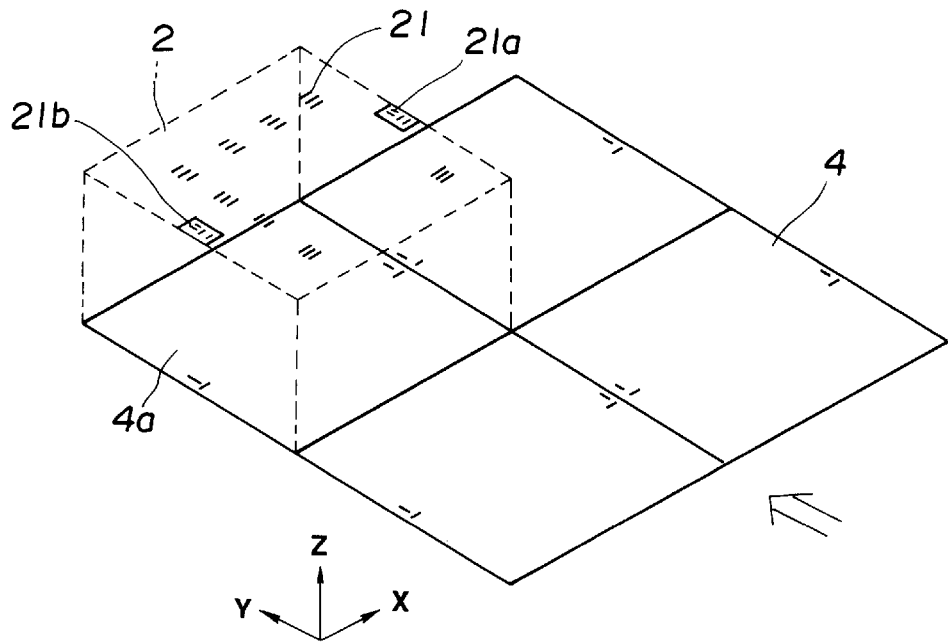
FIG. 9 is an explanatory diagram illustrating the relationship between a reticle pattern and a wafer.
Figure 10:
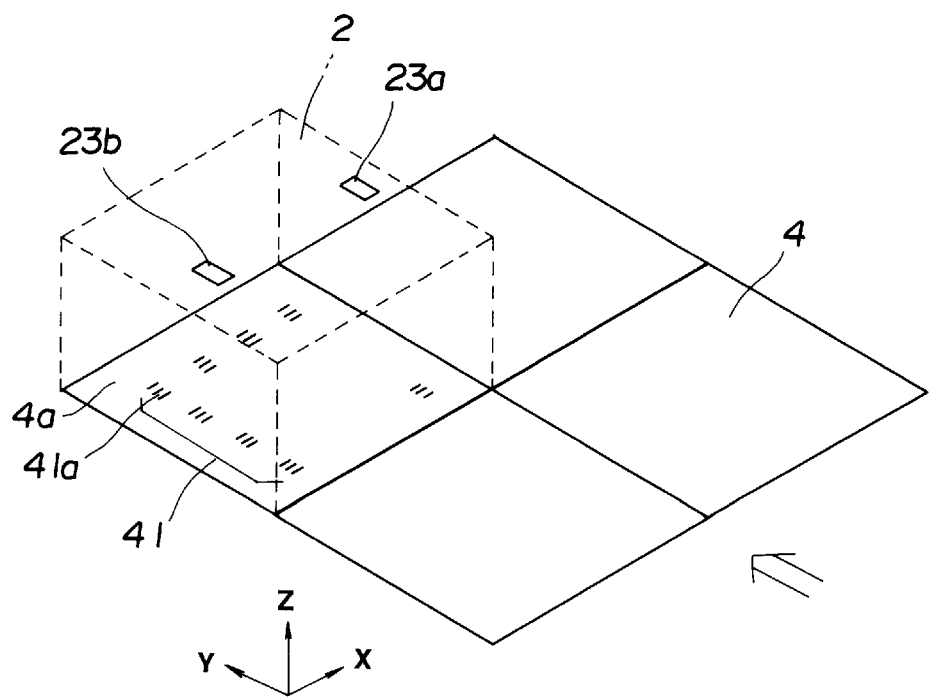
FIG. 10 is an explanatory diagram illustrating inspection marks printed on a wafer.

The obtained image is processed by control unit C, which calculates the amount of deviation and finely moves reticle stage 2a mounting reticle 2 to perform alignment. Upon the completion of the alignment, the exposure step SA005 is performed by opening exposure shutter 1a for printing reticle pattern 21 on reticle 2. The size of the light beam from exposure light source 1 projected onto reticle pattern 21 is then reduced to ⅕ its diameter after passing through reduction projection lens 3, and sensitizes the resist coated on wafer 4. Thus, an inspection pattern 41 is transferred onto wafer 4. This is accomplished by light from source 1 illuminating reticle pattern 21 above wafer 4, as shown in FIG. 9, to create an inspection pattern 41 on wafer 4 as shown in FIG. 10. As shown in FIG. 10, inspection pattern 41 comprises a plurality of inspection marks 41a which are two-dimensionally arranged in the xy plane and which are the result of projecting light from source 1 through pattern 21 onto wafer 4.

After the completion of the exposure and printing of first exposure region 4a (step SA005), the control unit C sets a new value for the focus for the next (i.e., second) exposure region in step S006. This value for the new focus is the value for the focus of the first exposure region, f, plus a distance df as seen in step SA006. The control unit C then determines whether all shots are completed in step SA006. If all the shots are not completed, for example, if only the first exposure region is exposed, the method returns to step SA002 where, for example, the second exposure region is then situated immediately below the reduction projection lens system 3 by moving XY stage 6 in step SA002 and autofocusing, autoalignment, exposure and printing operations are performed in steps SA003, SA004, SA005 as in the case of the first exposure region 4a.

Thereafter, inspection pattern 41 of reticle pattern 21 is exposed and printed on all exposure regions of wafer 4 according to a step-and-repeat procedure. Then, the control unit C determines in step SA007 that all the shots are completed and the process is returned to step S006 shown in FIG. 5.

In the autofocusing operation for each exposure region, the distance between reduction projection lens system 3 and wafer 4 on XY stage 6 in the z-axis direction (hereinafter termed the "focus") is changed by a distance df for each exposureregion by finely changing, stepwise, the distance between reduction projection lens system 3 and XY stage 6 for each exposure region.

This operation is necessary for detecting the best focus in the measuring process (step S010 shown in FIG. 5) of wafer 4 which has been exposed in the above-described manner and then developed by developing unit 94.

Figure 18A:
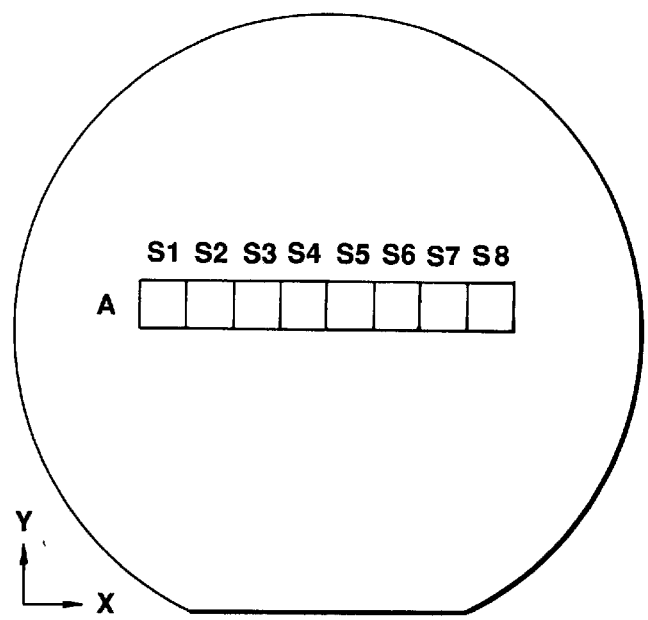
FIGS. 18(a) through 18(c) are diagrams illustrating the operation shown in the flowchart of FIG. 6.
Figure 18B:
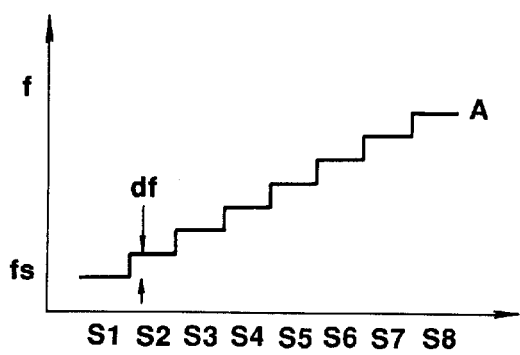
Figure 18C:
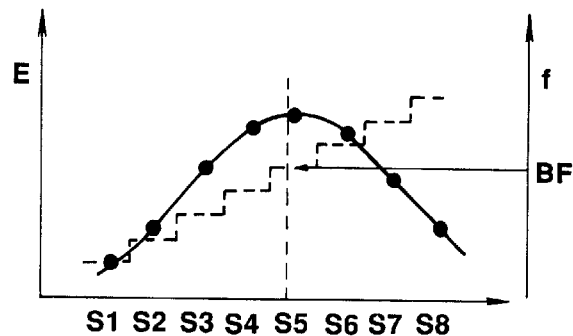
Figure 19A:
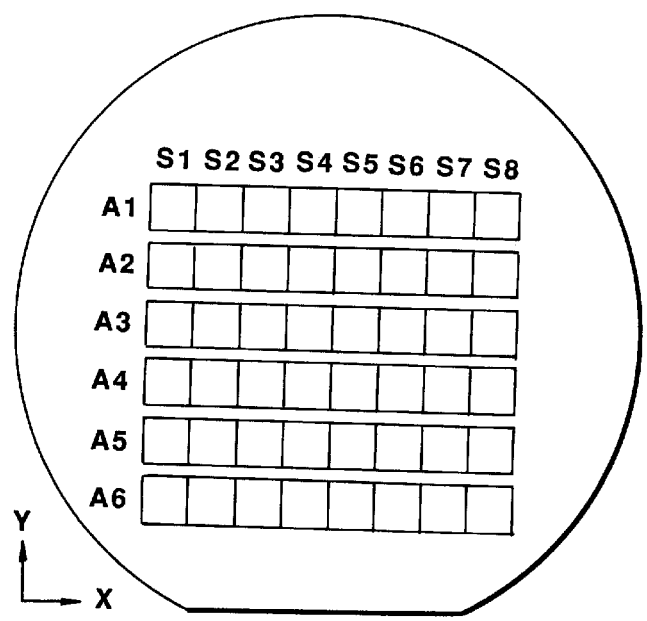
FIGS. 19(a) through 19(c) are diagrams illustrating the operation shown in the flowchart of FIG. 8.

The distance may be changed according to a method of continuously changing the distance in one dimension, as shown in FIG. 18(a), or according to a method of two-dimensionally exposing the wafer by repeating the above-described exposure operation a plurality of times, at least twice, as shown in FIG. 19(a). Measurement with higher accuracy can be obtained by adopting the method of two-dimensional exposure (to be described later). FIGS. 18(a), 18(b) and 18(c) show the method of changing the focus in one dimension. In FIG. 18(a) a plurality of exposure areas S1 . . . S8 are shown. These areas are aligned in the x-direction and are exposed in a step-and-repeat manner. In FIG. 18(b), the first focus position is represented by fs, and the amount of the subsequent change is represented by df. Accordingly, the first exposure shot performed at the focus fs corresponds to SI shown in FIG. 18(a), and the subsequent exposure shots which change the focus by df at each shot correspond to S2, S3, . . . . In other words, the focus at exposure area Si is fs+df. FIG. 19(a) shows a plurality of exposure areas in two dimensions in columns S1 to S8 and rows A1 to A6. In the case of the two-dimensional exposure, since the one-dimensional exposure pattern is repeated a plurality of times, the same changes in the focus are provided for rows A1 through A6 in areas S1–S8 (see FIGS. 19(b) and 19(c)) and exposure shots in each of areas S1, S2, . . . shown in FIG. 19(c) correspond to shots for the rows A1, A2, A3, . . . .

Since the inclination of the wafer surface is adjusted by the stage at each exposure by an autofocusing operation, the focal plane of the exposure light becomes parallel to the exposure region even if wafer 4 is warped or undulated, as shown in FIGS. 20(a) through 20(o). Specifically this is seen in FIGS. 20(b) and 20(c), 20(e) and 20(f), 20(h) and 20(i), 20(k) and 20(l), and 20(n) and 20(o). FIGS. 20(c), 20(f), 20(i), 20(l) and 20(o) show in an enlarged manner the circled portions shown in FIGS. 20(b), 20(e), 20(h), 20(k), and 20(n), respectively. For example, the exposure surface ES of the wafer surface WS, which is flat as shown in FIG. 20(a), is always parallel to the corresponding portion of the wafer surface WS, even if the inclination of the wafer is not adjusted. This is seen in FIGS. 20(b) and 20(c). In the case of the wafer surface WS which has a warp shown in FIG. 20(d), the exposure surface ES can be parallel to the wafer surface WS by adjusting the inclination (see FIG. 20(f)). FIGS. 20(g), 20(j) and 20(m) show wafers which have large undulations, small undulations, and fine projections and recesses, respectively. In each case, the focal plane of the exposure light is made to be parallel to the exposure region of the wafer by adjusting the inclination. This is seen in FIGS. 20(h), 20(i), 20(k), 20(l), 20(n), and 20(o).

Figure 7:
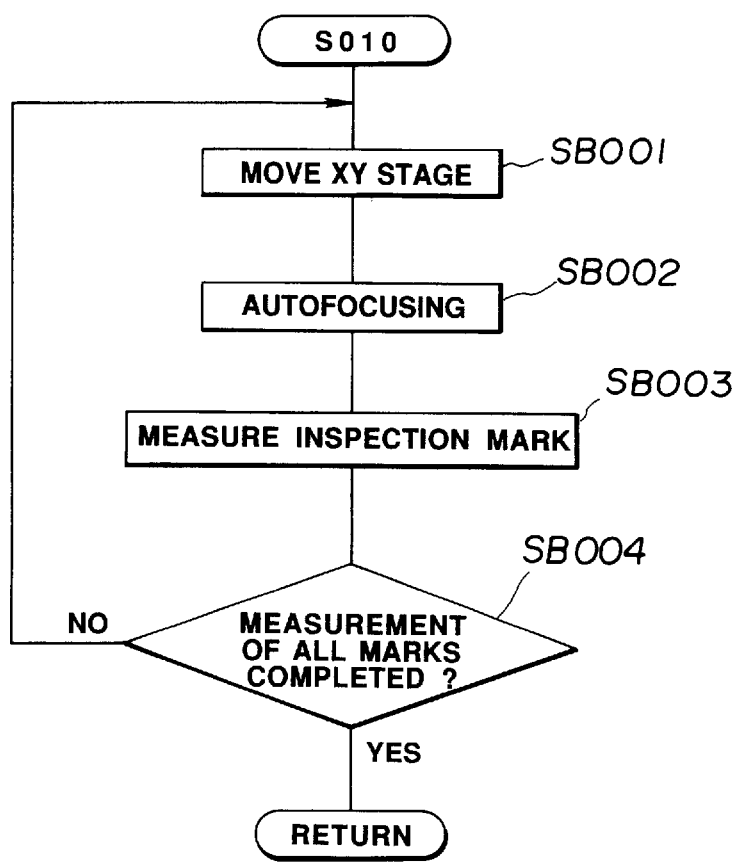
FIG. 7 is a flowchart showing a process of measuring inspection marks.

Next, the measuring process (step S010 shown in FIG. 5) will be explained with reference to FIG. 7.

Mirrors 74a and 74b are moved to the positions of measurement windows 23a and 23b (shown in FIG. 10) provided in reticle 2. Measurement performed simultaneously using the two measurement windows is effective, since the time of measurement is reduced by ½.

Each exposure region of developed wafer 4 is inspected by sequentially performing a step-and-repeat operation of XY stage 6. The movement of XY stage 6 during inspection is different from the movement during exposure. XY stage 6 is moved with a fine step so that all of the plurality of inspection marks 41a disposed in two dimensions within the exposure region can be observed. The measurement of inspection marks 41a is performed according to the procedure shown in FIG. 7.

XY stage 6 is moved and positioned (step SB001), the image of the inspection pattern in an arbitrary exposure region is received by first CCD camera 75, an autofocusing operation by image processing (step SB002, to be described later) is performed, and the position of XY stage 6 in the z-axis direction is set.

Thereafter, an evaluation value (to be described later) obtained from processing the image of the above-described inspection mark 41a is measured during image processing, and is stored in control unit C (step SB003). The control unit C then determines whether measurement of all the marks are completed in step SB004. If not, the steps SB001–SB003 are repeated for each of the inspection marks 41a. After measuring evaluation values of all the inspection marks 41a within the exposure region, the process proceeds to the next exposure region, and the same measurement process is performed.

Thereafter, the best focus BF, that is, the focus which is as close to the focal length of reduction projection lens system 3 as possible, is estimated by the following method. That is, as described above, in exposing and printing the inspection pattern on each exposure region, the focus is changed stepwise for each exposure region. Hence, the curve shown in FIG. 14 is obtained by plotting the evaluation value of the inspection pattern, e, arranged at a particular position in each exposure region, for example, the center of the region, PE, and the focus f corresponding to the maximum value of the curve, can be obtained to be the best focus BF.

The inclination of wafer 4 during exposure can be measured from the distribution of respective evaluation values of all the inspection marks printed on wafer 4. That is, the focus for each inspection mark is obtained from the evaluation value of the inspection mark. However, since it is impossible to determine whether the value is in the positive direction or in the negative direction with respect to the best focus BF, the determination is made from the behavior of a plurality of inspection marks at the same position within respective exposure regions for the focus of the inspection mark whose sign is to be determined.

Figure 15A:
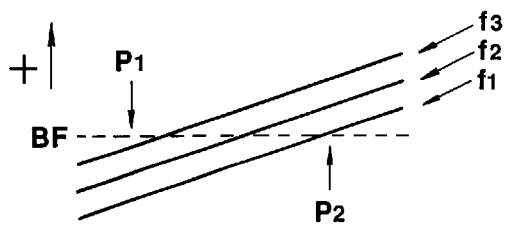
Figure 15C:
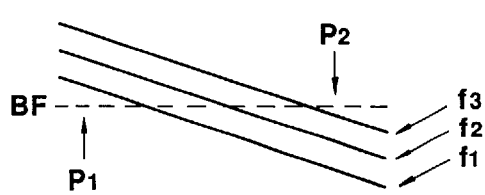
Figure 15B:
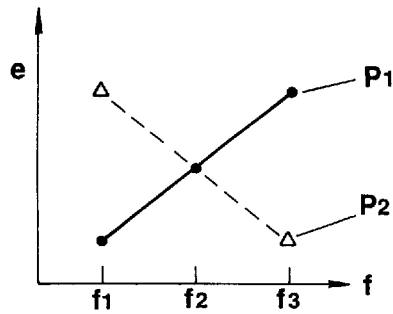
Figure 15D:
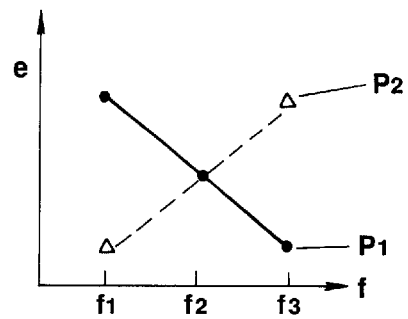

FIG. 15(a) shows one exposure region at three different distances, $f_1$, $f_2$ and $f_3$ from the reduction projection lens system 3. The exposure region is upwardly inclined in the rightward direction with respect to the best focus surface BF. FIG. 15(c) also shows one exposure region at three different distances, $f_1$, $f_2$ and $f_3$, from the reduction projection lens system 3. The exposure region in this figure is downwardly inclined in the rightward direction with respect to the best focus surface, BF. Evaluation values at points $P_1$ and $P_2$ on the exposure region in FIG. 15(a) are computed and are shown in FIG. 15(b). Similarly, the evaluation values at points $P_1$ and $P_2$ on the exposure region at the three different positions in FIG. 15(c) are computed and shown in FIG. 15(d). It can be understood that point $P_1$ gradually approaches the best focus BF since the focus in the exposure region monotonically increases as it moves from $f_1$ to $f_3$ in the positive direction. Point $P_2$ has a movement reverse to the above-described movement. Accordingly, it becomes clear that the focus increases in the case of point $P_1$ and decreases in the case of point $P_2$ as the exposure surface considered changes from $f_1$ to $f_3$.

Figure 16:
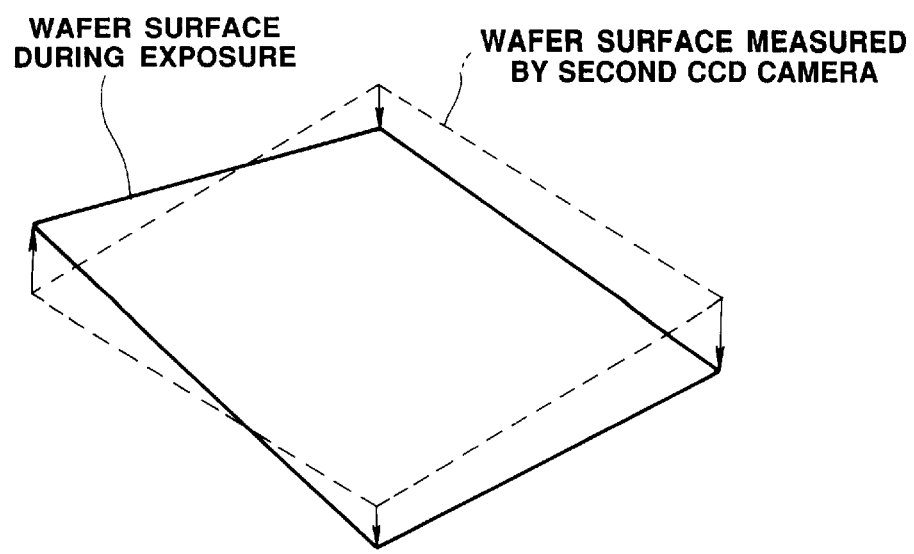
FIG. 16 is a schematic diagram illustrating the inclination of a wafer during exposure obtained from the distribution of evaluation values.

By thus plotting the focus values obtained from evaluation values for respective inspection marks, the inclination of the wafer surface during exposure is obtained as indicated by solid lines shown in FIG. 16. A deviation from the wafer surface (indicated by broken lines) measured by second CCD camera 82, that is, the measurement error of second CCD camera 82, is calculated from the above-described best focus BF and the inclination of the inspection wafer during exposure indicated by the solid lines shown in FIG. 16, and the calculated value is stored in control unit C. During the subsequent exposure of the wafer which will become a finished semiconductor product, a measured value obtained from the second CCD camera is automatically corrected based on the measurement error stored in control unit C.

Accordingly, it is possible to produce semiconductor products in which a defocused state due to the measurement error of autofocusing mechanism A is not present.

In the foregoing description, the influence of projections and recesses of a wafer is not considered. An actual wafer, however, has projections and recesses. Accordingly, even though the z-axis direction and the inclination of the wafer is adjusted by an autofocusing operation, the entire region of the exposed focal plane is not necessarily parallel to the exposure region. As a result, the curve showing the relationship between the focus and the evaluation value illustrated in FIG. 14 is in some cases not smooth.

In the above-described focusing mechanism, the adjustment in the z-axis direction and the inclination of the wafer is obtained using sensors at five points. In particular, the adjustment in the z-axis direction is performed using the average value of measured data of the sensors or the value of measured data of an assigned arbitrary sensor. However, even though the exposure focal plane ES is parallel to the wafer surface WS, the same distance cannot always be maintained at all positions within the exposure region due to the influence of small undulations of the wafer as shown in FIG. 20(1). In such a case, exposure within a certain amount of change df in the focus is not satisfactory. Accordingly, the curve shown in FIG. 14 is distorted, and therefore accuracy cannot be obtained in the process of obtaining the best focus BF from a graph made from a one-dimensional measurement.

Figure 19B:
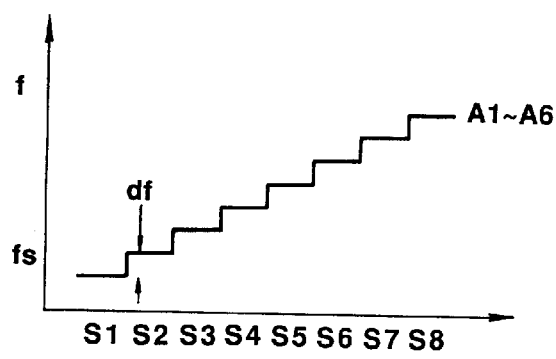
Figure 19C:
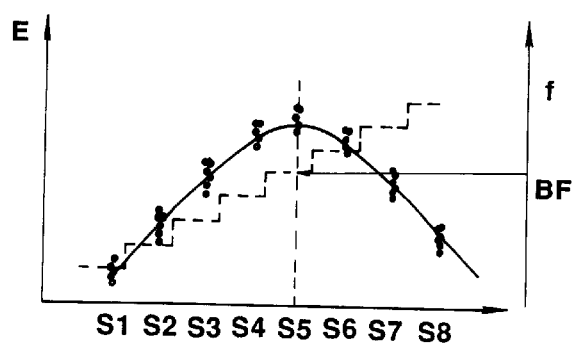

In order to improve accuracy in the measurement, the above-described two-dimensional exposure is performed, respective measurement marks are measured, and correction processing is performed based on data obtained for the same target focus position. In the two-dimensional exposure, a plurality of printing operations in which the exposure focus is sequentially changed stepwise by df are performed. The graphs shown in FIGS. 18(c) and 19(c) are obtained by plotting the results of measuring all the inspection marks after development, i.e., the evaluation value, against the exposure areas S1–S8 in which the measurements are taken. Thus, the abscissa represents the different exposure areas S1–S8 and the ordinate represents the evaluation value. In addition, superimposed on these graphs is the target value in the z axis direction, f. Also superimposed on FIGS. 18(c) and 19(c) are the graphs shown in FIGS. 18(b) and 19(b), respectively. The graph from FIG. 18(b) is shown in FIG. 18(c) in dashed lines, and the graph from FIG. 19(b) is shown in FIG. 19(c) in dashed lines. In data processing, an approximate curve is obtained from the plotted data, and the peak of the curve is then obtained.

A quadratic curve, a quartic curve, a hyperbola or the like obtained by minimizing least square errors of plotted points may be used as the approximate curve.

The approximate curve satisfies the following expression:

$$\sum_{i=1}^{N} (f(i) - ei)^2 = \text{minimum},$$

where N represents the number of data, f represents the expression of the curve to be fitted, and $e_i$ represents the measured evaluation value. Excellent exposure is performed if the exposure focus is determined using the best focus position which is thus obtained. Furthermore, the inclination of the image can be exactly determined if the focus position for each point within the exposure region is obtained according to the above-described method. The abovedescribed measurement in which a plurality of shots are exposed for one focus to obtain a plurality of measured data is effective not only when a small undulation is present on a wafer, but also when a wafer is flat or has warp, undulation, or minute projections and recesses.

Figure 8:
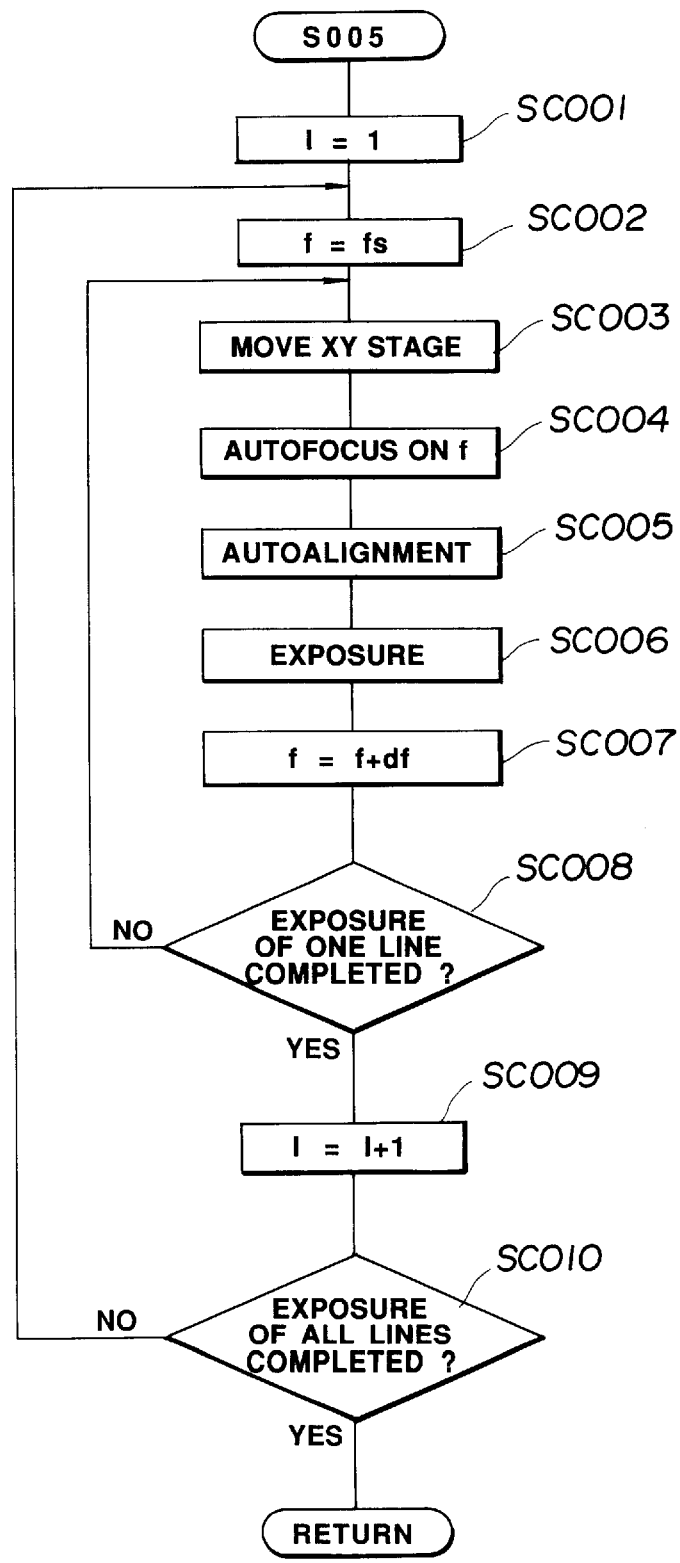
FIG. 8 is a flowchart showing the details of a principal part of the flowchart shown in FIG. 5.

Next, a description will be provided of the method when a plurality of rows are exposed. Step S005 (a step-and-repeat operation of exposure) shown in FIG. 5 is replaced by the flow chart shown in FIG. 8. There is no modification in the measurement since all exposed marks are measured. In order to sequentially expose regions in the first row 1 which represents a row or a line, is set to 1 in step SC001 and the target value f for the focus is set to an initial value fs (step SC002). The XY stage moves to the exposure position in step SC003, the target value in the z-axis direction for an autofocusing operation is set to the value f, and the inclination of the image is adjusted (step SC004). Thereafter, alignment is performed automatically in order to exactly adjust the exposure position in step SC005, and exposure is performed in step SC006. The target value of the focus for the next shot is changed by df in step SC007, and control unit C determines whether the exposure of one line or row is completed in step SC008. If the exposure of one line is completed, the control unit C adds 1 to 1 in step SC009. Next, in SC010, the control unit C determines whether the exposure of all the lines is completed. If not, the next line, 1+1, is exposed by initializing the target value of the focus to fs and repeating steps SC002–SC008. If the exposure of all the lines is completed, the process returns to S006 in FIG. 5.

Next, a description will be provided of a method of obtaining the above-described evaluation value from the image of the inspection pattern received by first CCD camera 75.

Figure 11A:
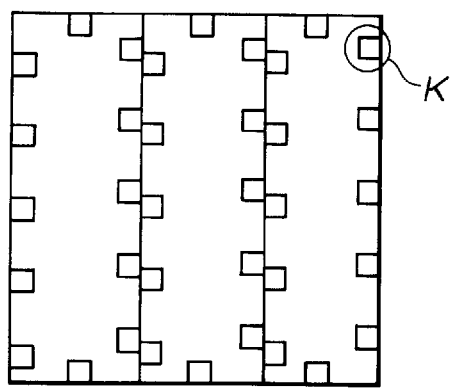
FIG. 11(*a*) is a schematic diagram showing the arrangement of inspection patterns on bonding pads.
Figure 11C:
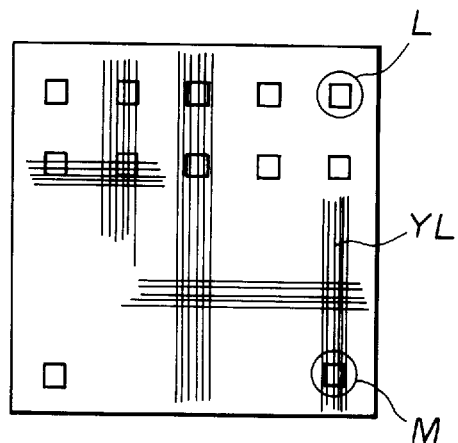
Figure 11B:
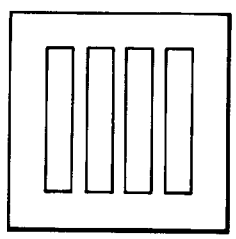
Figure 11D:
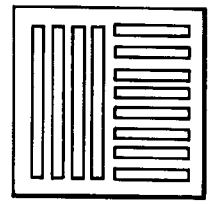
Figure 11E:
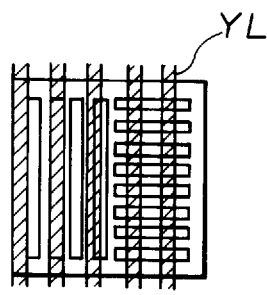

In general, a wafer, serving as an inspection substrate, has passed through some preliminary processes in semiconductor production. A region where projections and recesses, such as interconnection or the like, are not present is used for a portion where an inspection pattern is to be exposed and printed. For example, a bonding pad for connecting a semiconductor chip to a lead shown in FIG. 11(a) may be used. No projections and recesses are provided in this region throughout the entire process of semiconductor production. An inspection pattern such as that shown in FIG. 11(b) is formed in this region. The inspection pattern shown in FIG. 11(b) is formed within the circle K shown in FIG. 11(a). When forming a plurality of semiconductor chips within a region which can be simultaneously exposed, bonding pads are arranged two-dimensionally within the exposure region. Hence, the bonding pads are suitable for the measurement of the shape of the surface of a wafer. FIG. 11(a) shows a state in which three chips are formed within an exposure region.

FIG. 12(a) illustrates a state in which resist RE is coated on a wafer by resist coater 91 of the first embodiment. FIG. 12(b) illustrates the shape of the cross section of resist RE developed by developing unit 94 after a reticle pattern has been exposed and printed on resist RE by stepper S.

FIG. 12(c) illustrates the image of an inspection pattern received by first CCD camera 75. A signal representing the image to be processed by control unit C has a pattern compressed in the longitudinal direction of the mark, as shown in FIG. 12(d).

Next, a description will be provided of a method of calculating the evaluation value of the inspection pattern. The evaluation value represents the contrast of the signal obtained by first CCD camera 75. FIG. 12(e) illustrates the shape of the cross section of the resist after development in the case of the best focus, and the signal pattern obtained from the resist pattern. FIG. 12(f) illustrates the shape of the cross section of the resist in the case of a defocus, and the signal obtained from the resist pattern. The contrast of the signal is expressed by the following expression:

$$\mathrm{Con}(x)=|f(x-1)-f(x+1)|.$$

Con(x) is the contrast at point x on the wafer, f is a function representing the signal, f(x−1) is the value of the function at point x−1, and f(x+1) is the value of the function at point x+1.

This expression represents the differential of the signal. Next, the histogram of the contrast is obtained.

FIG. 13(a) shows the histogram of differential values of FIG. 12(e), and FIG. 13(b) shows the histogram of differential values of FIG. 12(f). The center of gravity of the area corresponding to about the upper 10% or a percentage set by the operator of the distribution of the histogram is calculated, and the calculated value is made the evaluation value of the contrast. In FIGS. 13(a) and 13(b), the ordinate represents the frequency, and the abscissa represents the differential value (contrast).

FIG. 14 is obtained by-plotting the evaluation value e of an inspection mark situated at a predetermined position, for example, the center within each exposure region, with respect to the focus f of the exposure region. The focus f during exposure corresponding to the maximum value PF of the evaluation value e is the best focus BF.

By obtaining the distribution of respective evaluation values for all inspection marks, the inclination of the wafer during exposure as indicated by solid lines shown in FIG. 16 can be obtained.

Next, a description will be provided of the above-described autofocusing operation by image processing (image AF).

Focus marks 4d and 4e are used for image AF. For obtaining the optimum height of XY stage 6, that is, the best focus, an evaluation function for quantifying the focus state of an image by the above-described image processing is used. Images are received by changing the height of XY stage 6, evaluation values of the evaluation function at respective heights are plotted by control unit C, and the height of XY stage 6 which is determined to have the highest evaluation value is made to be best focus BF. By adding an image AF mechanism, accuracy in the measurement is increased, and the stability of the measurement is also increased.

It is also possible to perform self-inspection of a reduction projection exposure apparatus by adopting the above-described inspection process. Evaluation of a reduction projection lens which has previously been performed by vernier evaluation by an inspection operator can be replaced by an automatic inspection process of the present invention in all processes of coating, exposure, development and inspection of a resist.

Figure 17A:
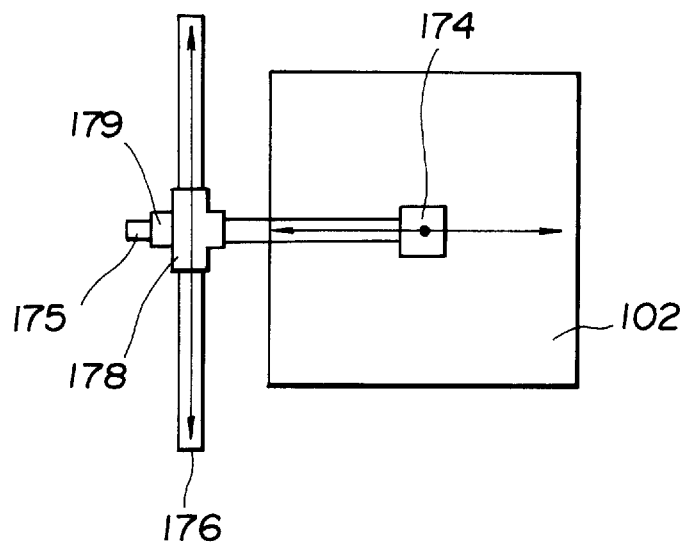
FIG. 17(a) is a partial plan view illustrating a second embodiment of the present invention.
Figure 17B:
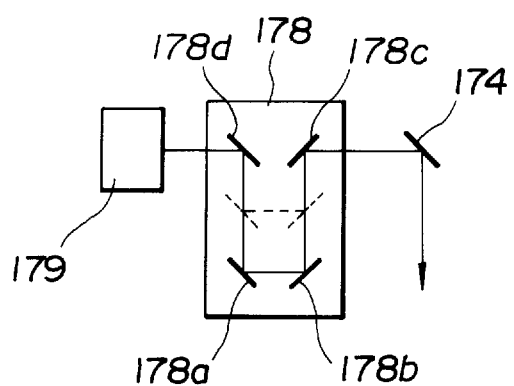
FIG. 17(b) is a schematic diagram showing the details of an optical-path-length correction apparatus in the second embodiment.

Next, a description will be provided of a second embodiment of the present invention shown in FIGS. 17(a) and 17(b).

In the second embodiment, a stepper, in which a mirror mounted on an alignment-scope can be moved to an arbitrary point above a reticle, is used. That is, as illustrated in FIG. 17(a), mirror 174 is mounted on a distal end of x-axis moving unit 175. Mirror 174 is moved to an arbitrary position along the x axis by the drive of x-axis moving unit 175.

X-axis moving unit 175 is mounted on y-axis moving unit 176, and the entire x-axis moving unit 175 can move to an arbitrary position along the y axis. Mirror 174 is thereby movable to an arbitrary position above reticle 102. If the position of mirror 174 is changed, the length of the optical path to first CCD camera 179, serving as image pickup means, is changed. Hence, optical-path-length correction unit 178 illustrated in FIG. 17(b) is provided on x-axis moving unit 175 as a correction mechanism of the length of the optical path. When mirror 174 is moved away from the main body of unit 175, internal mirrors 178*a* and 178*b* within opticalpath-length correction unit 178 move upwardly to the position shown in dashed lines to shorten the optical path within optical-path-length correction unit 178. When mirror 174 comes close to the main body of the x-axis moving unit 175, the length of the optical path within optical-pathlength correction unit 178 is lengthened by moving internal mirrors 178*a* and 178*b* downwardly. As can be seen in FIG. 17(*b* ) light is reflected from mirror 174 to mirror 178*c,* mirror 178*b,* mirror 178*a,* and mirror 178*d,* to the first CCD camera 179.

That is, by moving internal mirrors 178*a* and 178*b* of optical-path-length correction unit 178 linked with x-axis moving unit 175, the length of the optical path to first CCD camera 179 for receiving reflected light can be maintained constant.

Since processing and performing alignment of a wafer by first CCD camera 179, exposing and printing an inspection pattern, mounting the wafer again after development in the stepper, and measuring the inspection pattern printed on the wafer is the same as in the first embodiment, an explanation thereof will be omitted.

Figure 21:
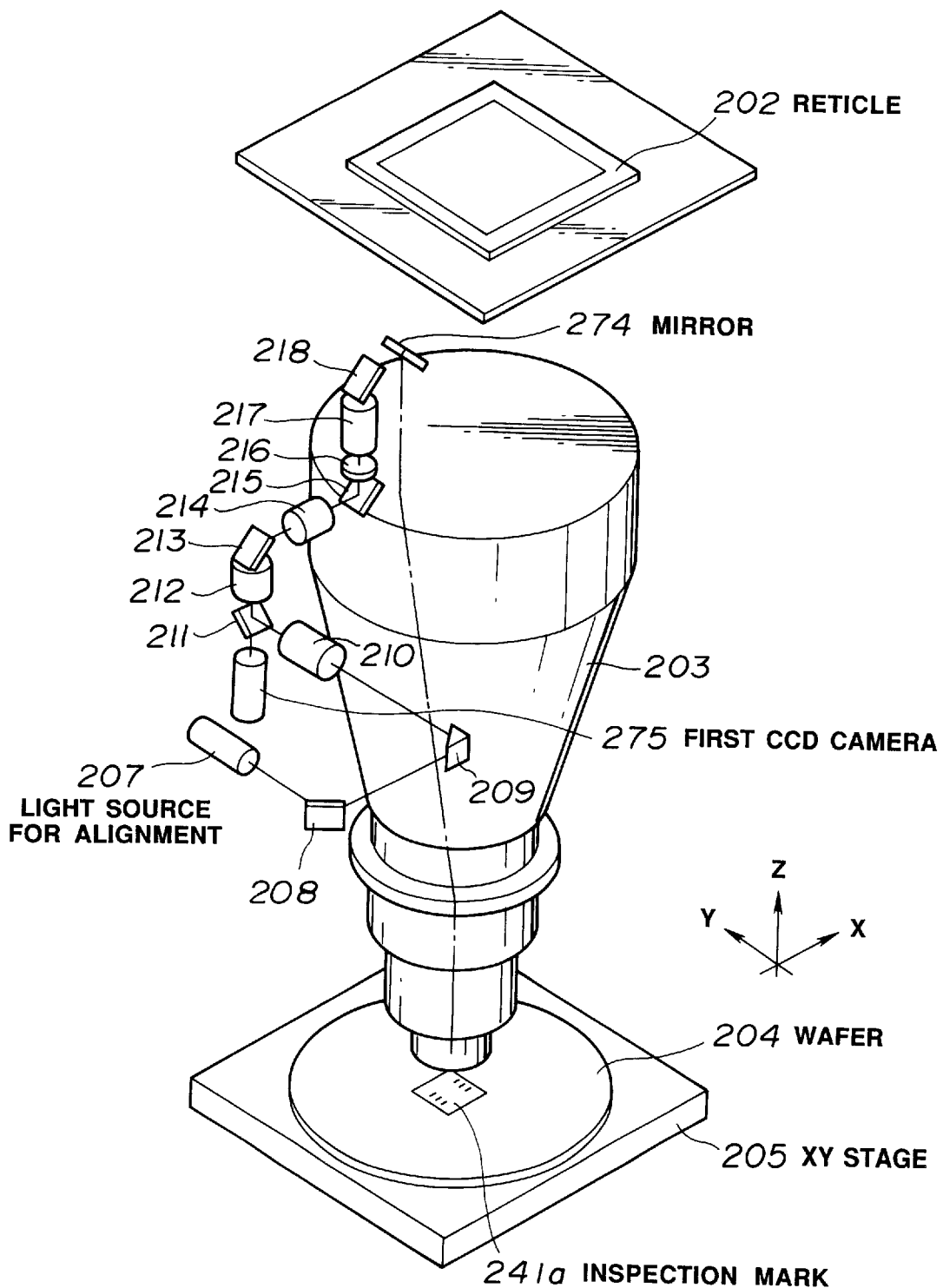
FIG. 21 is a schematic, perspective view of an apparatus according to a third embodiment of the present invention.

Next, a description will be provided of a third embodiment of the present invention with reference to FIG. 21.

In the third embodiment, an alignment mirror for measuring a printed inspection pattern is always at a fixed position. Light from an alignment light source 207 is transmitted to a mirror 274 via optical element 208, prism 209, lens 210, mirror 211, lens 212, mirror 213, lens 214, mirror 215, lens 216, lens 217 and mirror 218. Mirror 274 for projecting illuminating light from alignment light source 207 onto the inspection pattern via reduction projection lens system 203 is set at a position of not obturating exposure light when wafer 204 is exposed with a reticle pattern provided on reticle 202. Since mirror 274 is fixed, the inspection pattern printed on wafer 204 is observed by controlling the position of XY stage 205 on which wafer 204 is mounted. For example, light reflected from each of a plurality of inspection marks 241*a* within one exposure region shown in FIG. 16 is received in first CCD camera 275, serving as image pickup means, by moving XY stage 205 by the distance between the inspection marks via reduction projection lens system 203, mirror 274, mirror 218, lens 217, lens 216, mirror 215, lens 214, mirror 213, lens 212, and mirror 211 which transmits light from the lens 212 to the first CCD camera 275.

The images of inspection marks received by first CCD camera 275 are processed by the same control unit (not shown) as in the first embodiment, and evaluation values are calculated. Since other processes are the same as in the first embodiment, an explanation thereof will be omitted.

It is also possible to obtain the image of an inspection pattern using off-axis optical system 64, shown in FIG. 1, which does not pass through the reduction projection lens system shown in FIG. 1. In such a case, in alignment for exposing and printing the inspection pattern, measurement using the above-described off-axis optical system may be utilized. In this case, exposure is performed after performing global alignment.

Since off-axis optical system 64 is fixed, each of the printed inspection marks is observed by moving XY stage 6, on which wafer 4 is mounted, immediately below off-axis optical system 64. Off-axis optical system 64 comprises a light source, a microscope, a CCD camera, serving as image pickup means, and the like. The image of each inspection mark illuminated by light emitted from the light source is magnified by the microscope, and the magnified image is imaged onto the CCD camera.

The images received by the CCD camera are processed by control unit C to obtain evaluation values. The movement of XY stage 6, the reception of images, and the processing of the received images are performed for all inspection marks by a step-and-repeat process.

In the second and third embodiments, it is unnecessary to provide windows for observing inspection marks in a reticle.

In the foregoing description, a flat region, such as a bonding pad or the like, is used for locating the inspection mark. If such a region cannot be used, an inspection mark illustrated in FIG. 11(*d* ) may be utilized. The evaluation mark shown in FIG. 11(*d* ) has line patterns both in the x-axis direction and the y-axis direction. If a region which does not have a pattern is exposed with the above-described pattern, the inspection mark observed by the CCD camera has the configuration shown in FIG. 11(*d* ). The inspection pattern shown in FIG. 11(*d* ) is located within circle L on a portion of a integrated circuit shown in FIG. 11(*c* ). FIG. 11(*c* ) also shows an inspection pattern such as that contained within circle M shown in FIG. 11(*e* ), superimposed on an integrated circuit pattern YL.

If a region to be exposed has an IC (integrated circuit) interconnection pattern, for example, as illustrated in FIG. 11(*e* ), a region having a line pattern YL in the y-axis direction is observed as illustrated in FIG. 11(*e* ). In such a case, a correct evaluation value can be obtained if the evaluation of the amount of the focus by image processing is performed using only a lateral-line pattern. Moreover, no limitation is present in the position of measurement. The evaluation of the amount of the focus by image processing can be easily performed by changing the degree of compression in the longitudinal direction of the mark. By thus selecting the direction of the inspection pattern to be the vertical, the horizontal or the oblique direction, the area occupied by the inspection mark can be reduced.

It is also possible to use a reticle for manufacturing an IC without using a reticle having a particular inspection pattern. That is, the uppermost exposed interconnection pattern itself is used as the inspection pattern. In such a case, since the direction and the position of the pattern is known when the reticle is designed, the position and the direction of the inspection pattern may be input to the stepper as parameters with a simple operation.

In the first embodiment, a He—Cd laser or the like, whose wavelength is close to the wavelength of the exposure light, is generally used as alignment light source 7. However, a He—Ne laser or the like, whose wavelength is not close to the wavelength of the exposure light, may also be used. In this case, it is necessary to provide an optical system for correcting chromatic aberration.

A method of measuring the length of the edge of an inspection mark may be used as a method of calculating the amount of exposure or the evaluation value of the focus of exposure. In such a case, it is easier to perform the evaluation if the ratio of a portion where the resist remains to a portion where the resist does not remain is obtained.

The evaluation can also be performed by obtaining the distribution (histogram) in illuminance when a hatched pattern is used as an inspection pattern and the image of the pattern is received by a CCD camera.

For example, when optimum exposure is performed, since the contrast between the edge portion and the other portion of the pattern is high, the distribution of illuminance consisting of two clearly divided histograms of the edge portion and the other portion, is obtained. On the other hand, when optimum exposure is not performed, the distribution does not comprise two divided histograms, since the contrast between the edge portion and the other portion is reduced.

Any shape may be adopted for the inspection mark, provided that the exposed portion can be discriminated from the unexposed portion during exposure.

The present invention may be applied to all kinds of exposure apparatuses having a measurement optical system for alignment in addition to reduction projection exposure apparatuses, such as steppers or the like.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

The individual electrical and optical components represented by the blocks shown in FIGS. 1–3, 17(a), 17(b), and 21 are well known in the semiconductor exposure art and their specific construction and operation is not critical to the invention or the best mode for carrying out the invention. Moreover the steps shown in FIGS. 5–8 for carrying out the present invention can be easily programmed into well-known central processing units by persons of ordinary skill in the art and since such programming per se is not part of the invention, no further description thereof is deemed necessary.

What is claimed is:

1. A semiconductor manufacturing method comprising the steps of:

setting an inspection substrate in an exposure apparatus, the exposure apparatus having a projection optical system, measuring means and image pick-up means;

measuring a position of the inspection substrate with respect to the focal plane of the projection optical system with the measuring means;

exposing the inspection substrate through the projection optical system so as to print an inspection pattern having a plurality of inspection marks in one exposure region of the inspection substrate on the inspection substrate;

changing the distance between the projection optical system and the inspection substrate by a predetermined distance and performing said measuring step again and then exposing a different region through the projection optical system so as to print an inspection pattern having a plurality of inspection marks in the different exposure region on the inspection substrate;

performing said changing step a plurality of times to progressively increase or decrease the distance between the projection optical system and the inspection substrate by the same predetermined amount as different exposure regions have an inspection pattern printed thereon;

removing the inspection substrate from the exposure apparatus;

developing the inspection pattern printed on the inspection substrate;

re-setting the inspection substrate in the exposure apparatus;

obtaining image data of the developed inspection pattern on the inspection substrate by the image pick-up means;

calculating error data representing an error produced by the measuring means during the measuring operation by calculating an evaluation value of each printed inspection mark at different exposure regions of the inspection substrate representing the contrast of the inspection pattern at the different regions, and by determining the inclination of the inspection substrate with respect to the focal plane by the distribution of evaluation values of the inspection marks with respect to the focus of the projection optical system for each exposure region;

storing the error data in control means;

setting a semiconductor substrate instead of the inspection substrate in the exposure apparatus;

measuring a position of the semiconductor substrate with respect to the focal plane of the projection optical system by the measuring means;

obtaining corrected data on the basis of the error data stored in the control means and the position data of the semiconductor substrate measured by the measuring means;

adjusting the position of the semiconductor substrate with respect to the focal plane of the projection optical system on the basis of the corrected data; and exposing the semiconductor substrate through the projection optical system.

2. A method according to claim 1, wherein the inspection pattern is printed on each of a plurality of regions on the inspection substrate, and the distance between the projection optical system and the inspection substrate varies every time the inspection pattern is printed on each of the plurality of regions.

3. A method according to claim 2, further comprising the steps of:

obtaining an evaluation value from image data of the printed inspection pattern on each of the regions; and determining the error data by utilizing variations in the evaluation value of each of the regions.

4. A method according to claim 3, wherein the error data include data relating to the distance between the projection optical system and the inspection substrate.

5. A method according to claim 2, further comprising the steps of:

obtaining an evaluation value from image data of the inspection pattern printed on each of the regions; and determining the error data utilizing a distribution of the evaluation values of each of the regions.

6. A method according to claim 5, further comprising measuring an inclination of the inspection substrate with the measuring means, and wherein the error data include data relating to the measurement of the inclination of the inspection substrate.

7. A semiconductor manufacturing system comprising:

an exposure apparatus for exposing a photosensitive material on an inspection substrate, said exposure apparatus comprising:

a projection optical system for projecting an inspection pattern having a plurality of inspection marks on the inspection substrate in different exposure regions of the inspection substrate;

image pick-up means for imaging the inspection pattern on the surface of the inspection substrate;

measuring means for measuring the position of the inspection pattern with respect to the focal plane of said projection optical system; and means for changing the distance between said projection optical system and the inspection substrate, wherein said changing means progressively increases or decreases the distance between said projection optical system and the inspection substrate by the same predetermined amount, as different exposure regions have projected thereon the inspection pattern so that if the distance between said projection optical system and the inspection substrate is f for a first exposure region, the distance between said projection optical system and the inspection substrate in second, third, and fourth exposure regions is f+df, f+2df, and f+3df;

a processing apparatus for processing the inspection substrate, said processing apparatus comprising:
coating means for coating the photosensitive material on the inspection substrate; and
developing means for developing the photosensitive material on the inspection substrate to produce a developed inspection pattern comprising a plurality of developed inspection marks;

a conveying unit for conveying the inspection substrate between said exposure apparatus and said processing apparatus, said conveying unit comprising:
supplying conveying means for conveying the inspection substrate on which the photosensitive material is coated by the coating means to said exposure apparatus; and
receiving conveying means for conveying the inspection substrate exposed by said exposure apparatus to said developing means; and a control unit for controlling said conveying unit to reset the inspection substrate on which the photosensitive material is developed by said developing means of said processing apparatus into said exposure apparatus,
wherein said control unit calculates and stores error data representing an error produced by said measuring means during the measuring operation by calculating an evaluation value of each developed inspection mark at different exposure regions of the inspection substrate representing the contrast of the inspection pattern at the different regions, and by determining the inclination of the inspection substrate with respect to the focal plane by the distribution of evaluation values of the inspection marks with respect to the focus of the projection optical system for each exposure region,
wherein said control unit controls said conveying unit to convey the inspection substrate out of said exposure apparatus and to convey a semiconductor substrate to said exposure apparatus,
wherein said control unit controls said measuring means to measure a position of the semiconductor substrate with respect to the focal plane of said projection exposure optical system,
wherein said control unit calculates corrected data on the basis of the calculated error data and the position data of the semiconductor substrate measured by said measuring means,
wherein said control unit adjusts the position of the semiconductor substrate with respect to the focal plane of said projection optical system on the basis of the corrected data, and
wherein said control unit controls said exposure apparatus to expose the semiconductor substrate through said projection optical system.

8. A system according to claim 7, wherein said image pick-up means obtains an image of an alignment mark on the substrate, comprising the inspection pattern, and the obtained alignment data is utilized for aligning the substrate.

9. A system according to claim 7, wherein said image pick-up means obtains an image of the surface of the substrate through an off-axis optical system arranged in said exposure apparatus.

10. A method for fabricating a substrate so as to manufacture a device, comprising the steps of:
setting a first substrate in an apparatus, the apparatus having printing means, measuring means and image pick-up means;
measuring a position of the first substrate with respect to a printing plane of the printing means by the measuring means;
printing a pattern having a plurality of marks on one exposure region of the first substrate with the printing means;
changing the distance between a projection optical system for performing said printing and the first substrate by a predetermined distance and then Printing a pattern on a different exposure region of the first substrate;
performing said changing step a Plurality of times to progressively increase or decrease the distance between the projection optical system and the first substrate by the predetermined amount as different exposure regions have patterns printed thereon so that if the predetermined distance is df and the distance between the projection optical system and the first substrate for printing on a first exposure region is f, then the distance between the projection optical system and the first substrate in second, third, and fourth exposure regions is f+df, f+2df, and f+3df;
removing the first substrate from the apparatus;
executing a predetermined process with the first substrate removed from said apparatus;
re-setting the first substrate in the apparatus;
obtaining image data of the pattern on the first substrate with the image pick-up means;
calculating error data representing an error produced by the measuring means during a measuring operation by calculating an evaluation value of each printed mark at different exposure regions of the first substrate representing the contrast of the pattern at the different regions, and by determining the inclination of the first substrate with respect to the printing plane by the distribution of evaluation values of the inspection marks with respect to the focus of the printing means for each exposure region;
storing the error data in control means;
setting a second substrate instead of the first substrate in the apparatus;
measuring a position of the second substrate with respect to the printing plane of the printing means with the measuring means;
obtaining corrected data on the basis of the error data stored in the control means and the position data of the second substrate measured by the measuring means;
adjusting the position of the second substrate with respect to the printing plane of the printing means on the basis of the corrected data; and
printing a pattern on the second substrate with the printing means.

* * * * *

UNITED STATES PATENT AND TRADEMARK OFFICE
CERTIFICATE OF CORRECTION

PATENT NO. : 5,815,594

DATED : September 29, 1998

INVENTOR(S) : Hiroshi TANAKA

It is certified that error appears in the above-identified patent and that said Letters Patent is hereby corrected as shown below:

COLUMN 1:

Line 5, "07/998/609" should read --07/998,609--.

COLUMN 5:

Line 5, "camera," should read --camera;--;
    Line 6, "Fig. 12(d)" should begin a new paragraph; and
    Line 14, "6 Fig. 13(a)" should read --Fig. 13(a)--.

COLUMN 6:

Line 37, "61aand" should read --61a and--.

COLUMN 9:

Line 48, "exposureregion" should read --exposure region--.

COLUMN 10:

Line 4, "SI" should read --S1--; and
    Line 7, "Si" should read --S2--.

UNITED STATES PATENT AND TRADEMARK OFFICE
CERTIFICATE OF CORRECTION

PATENT NO. : 5,815,594

DATED : September 29, 1998

INVENTOR(S) : Hiroshi TANAKA

It is certified that error appears in the above-identified patent and that said Letters Patent is hereby corrected as shown below:

COLUMN 12:

Line 62, "abovedescribed" should read
--above-described--.

COLUMN 14:

Line 17, "by-plotting" should read --by plotting--.

COLUMN 15:

Line 4, "opticalpath-length" should read
--optical-path-length--; and
Line 9, "optical-pathlength" should read
--optical-path-length--.

COLUMN 16:

Line 21, "a" should read --an--.

COLUMN 19:

Line 3, "amount," should read --amount, df,--.

UNITED STATES PATENT AND TRADEMARK OFFICE
CERTIFICATE OF CORRECTION

PATENT NO. : 5,815,594

DATED : September 29, 1998

INVENTOR(S) : Hiroshi TANAKA

Page 3 of 3

It is certified that error appears in the above-identified patent and that said Letters Patent is hereby corrected as shown below:

COLUMN 20:

```
Line 1,  "substrate," should read --substrate--;
Line 21, "Printing" should read --printing--; and
Line 23, "Plurality" should read --plurality--.
```

Signed and Sealed this

Fifteenth Day of June, 1999

Q. TODD DICKINSON

Attest:

*Attesting Officer*   *Acting Commissioner of Patents and Trademarks*